(12) United States Patent
Moro et al.

(10) Patent No.: US 8,748,780 B2
(45) Date of Patent: Jun. 10, 2014

(54) SUBSTRATE PROCESSING APPARATUS, SUBSTRATE PROCESSING METHOD, AND COMPUTER-READABLE STORAGE MEDIUM

(75) Inventors: Shouken Moro, Koshi (JP); Yasuhiro Takaki, Koshi (JP); Masatoshi Kaneda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1853 days.

(21) Appl. No.: 12/007,892

(22) Filed: Jan. 16, 2008

(65) Prior Publication Data
US 2008/0171131 A1 Jul. 17, 2008

(30) Foreign Application Priority Data

Jan. 17, 2007 (JP) ................. 2007-008431

(51) Int. Cl.
| | | |
|---|---|---|
| B05C 13/00 | (2006.01) | |
| C23C 16/52 | (2006.01) | |
| B05C 11/00 | (2006.01) | |
| B05D 3/02 | (2006.01) | |
| H01L 21/687 | (2006.01) | |
| G03F 7/20 | (2006.01) | |
| C23C 16/00 | (2006.01) | |
| H01L 21/683 | (2006.01) | |

(52) U.S. Cl.
CPC ........ *H01L 21/6875* (2013.01); *G03F 7/70708* (2013.01); *C23C 16/00* (2013.01); *H01L 21/683* (2013.01); *B05C 11/00* (2013.01)
USPC ........... 219/390; 219/410; 219/521; 422/560; 422/563; 432/259; 432/152; 432/258; 432/253; 118/724; 118/725; 118/59; 237/11; 237/12; 237/2 A; 237/81; 361/234; 156/345.53; 156/345.51; 269/21

(58) Field of Classification Search
CPC . H01L 21/67; H01L 21/6833; H01L 21/6875; H01L 21/683; B05C 11/00; C23C 16/00; G03F 7/70708
USPC ........... 219/390, 443.1; 118/724, 725, 59, 69, 118/500; 236/165; 237/11, 12, 2 A, 81; 422/560, 563, 566, 186; 432/253, 258, 432/259; 361/234, 324; 269/21
See application file for complete search history.

(56) References Cited

U.S. PATENT DOCUMENTS 5,564,682 A * 10/1996 Tsuji ............................ 269/21
6,290,274 B1 * 9/2001 Montoya ....................... 279/3
6,307,184 B1 * 10/2001 Womack et al. ............. 219/390

(Continued)

FOREIGN PATENT DOCUMENTS

| JP | 6-338450 | 12/1994 |
| JP | 10-284360 | 10/1998 |

(Continued)

OTHER PUBLICATIONS

Japanese Office Action mailed on Sep. 6, 2011 for Application No. 2007-008431 with English translation.

*Primary Examiner* — Henry Yuen
*Assistant Examiner* — Diallo I Duniver
(74) *Attorney, Agent, or Firm* — Smith, Gambrell & Russell LLP

(57) ABSTRACT

A disclosed substrate processing apparatus comprises a heat exchange plate configured to heat and/or cool the substrate; plural protrusions provided on the heat exchange plate so as to allow the substrate to be placed on the plural protrusions, leaving a gap between the substrate and the heat exchange plate; a suction portion configured to attract the substrate onto the plural protrusion by suction through plural holes formed in the heat exchange plate; and a partition member that is provided on the heat exchange plate and lower than the plural protrusions, wherein the partition member is configured to divide the gap into two or more regions including at least one of the holes so that at least one of the two or more regions is two-dimensionally closed by the partition member.

21 Claims, 17 Drawing Sheets

(56) References Cited

U.S. PATENT DOCUMENTS

| | | | |
|---|---|---|---|
| 6,320,736 B1* | 11/2001 | Shamouilian et al. | 361/234 |
| 6,628,503 B2* | 9/2003 | Sogard | 361/324 |
| 8,003,919 B2* | 8/2011 | Goto et al. | 219/390 |
| 2005/0149886 A1* | 7/2005 | Kaushal et al. | 716/2 |
| 2005/0211694 A1* | 9/2005 | Moroz | 219/390 |
| 2006/0090855 A1* | 5/2006 | Kimura | 156/345.52 |
| 2006/0241891 A1* | 10/2006 | Kaushal et al. | 702/136 |
| 2006/0289432 A1* | 12/2006 | Morita et al. | 219/390 |
| 2007/0128570 A1* | 6/2007 | Goto et al. | 432/253 |

FOREIGN PATENT DOCUMENTS

| | | |
|---|---|---|
| JP | 2001-60617 | 3/2001 |
| JP | 2006-210400 | 8/2006 |

* cited by examiner

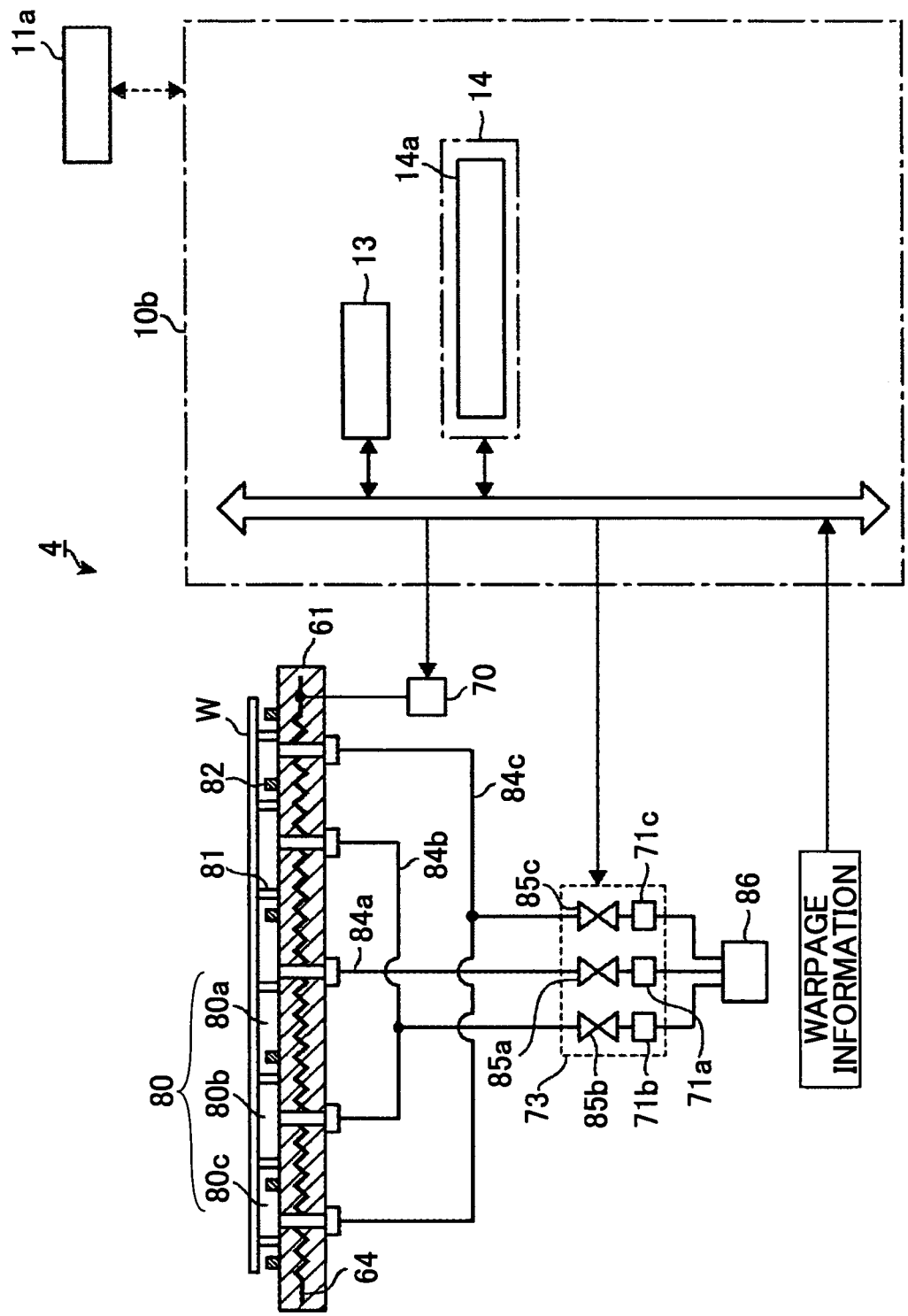

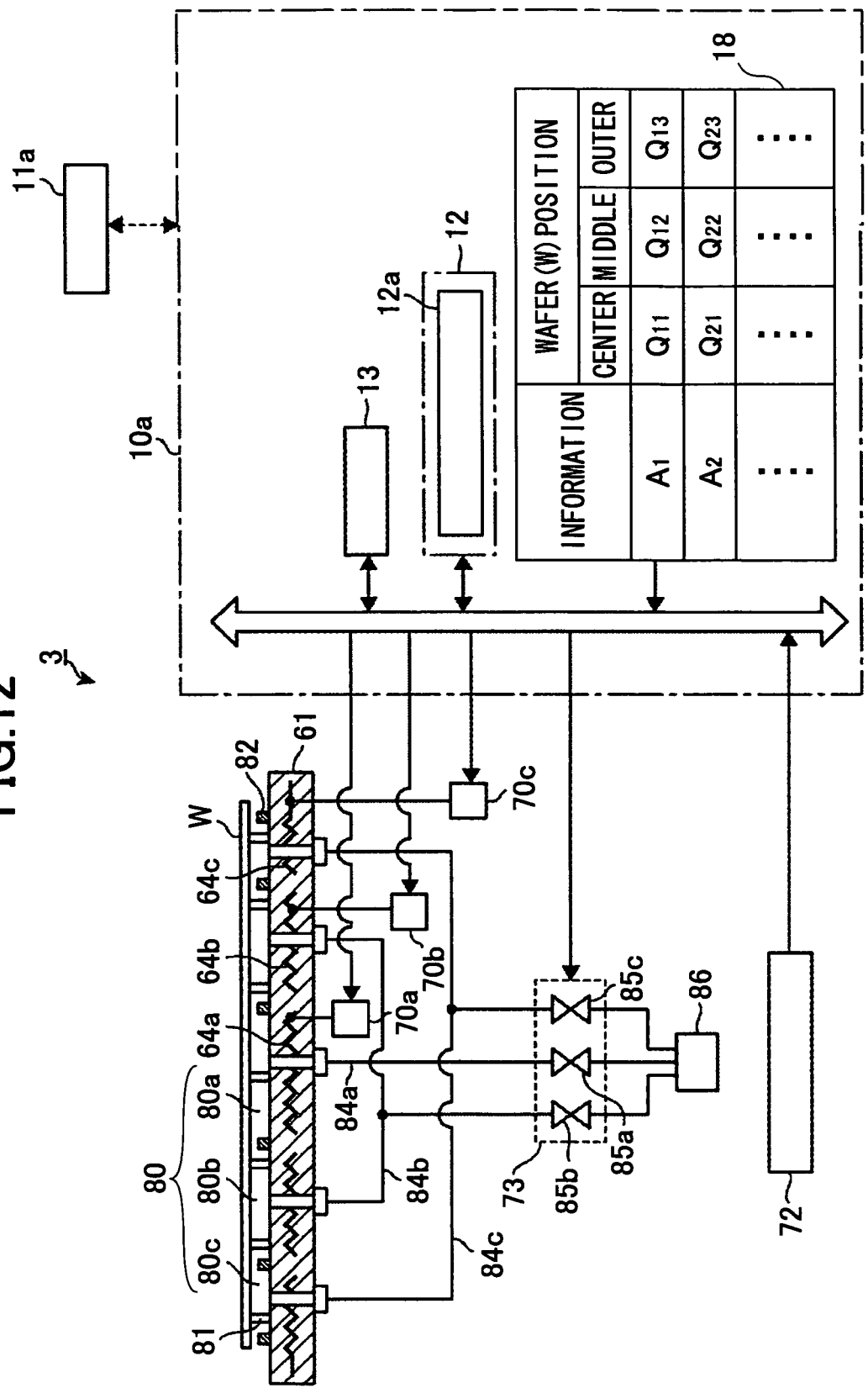

SUBSTRATE PROCESSING APPARATUS, SUBSTRATE PROCESSING METHOD, AND COMPUTER-READABLE STORAGE MEDIUM

BACKGROUND OF THE INVENTION

1. Field of the Invention

The present invention relates to a substrate processing apparatus and a substrate processing method that heats and/or cools a substrate, and a computer-readable storage medium storing a program for causing the substrate processing apparatus to perform the substrate processing method.

2. Description of the Related Art

A coater/developer for coating an organic material film such as a resist film or the like on a substrate and developing the film is provided with a substrate processing apparatus for heating and/or cooling the substrate.

As an example of such a substrate processing apparatus, a substrate heating apparatus 101 is described in reference to FIG. 1. In the substrate heating apparatus 101, a substrate 103 is placed on a thermal plate 102 and heated by a heater 104 embedded in the thermal plate 102. During heating the substrate 103, nitrogen is supplied toward the substrate 103 so as to purge volatile substances such as organic solvents from the organic film. While the nitrogen or the like is exhausted by an exhaust apparatus 110, the volatile substances are collected by a collection portion 105. In such a substrate heating apparatus 101, when the back surface of the substrate 103 directly contacts the top surface of the heating plate 102, particles may be attached on the back surface of the substrate 103. In order to avoid the particles attaching on the back surface, the thermal plate 102 is provided with plural pins 108 and the substrate 103 is placed on the plural pins 108. In this configuration, the substrate 103 is heated through an air layer, which is generally referred to as a proximity gap, formed between the back surface of the substrate 103 and the top surface of the thermal plate 102.

By the way, when a film, for example, a resist film is formed on the substrate 103, the stress between the film and the substrate 103 may cause the substrate 103 to be warped into a bowl (or concave) shape or a dome (or convex) shape. In order to uniformly heat the substrate 103 even in this situation, there is known a thermal processing technique in which the heat plate 102 is provided with plural suction conduits 106 through which the substrate 103 is attracted onto the heat plate 102 by a vacuum pump 107, thereby maintaining the substrate 103 to be flat with respect to the heat plate 102.

The technique is described in reference to FIGS. 2A through 2B, where the concavely warped substrate 103 is used. As shown in FIG. 2A, when the substrate 103 is placed on the heat plate 102 and if the suction through the suction conduits 106 is not in operation, the substrate 103 is concavely warped. In this case, a lowest portion of the substrate 103 (or a center bottom portion of the bowl-shaped substrate 103) sits on the pins 108 and circumferential portions of the substrate 103 are separated from the pins 108. When the substrate 103 is suctioned through the suction conduits 106, a portion of the substrate 103 that is closer to the heat plate 102 (or a portion around the center bottom portion) is strongly drawn to the heat plate 102 and comes in contact with the pins 108 as shown in FIG. 2B. In this manner, the substrate 103 is straightened so as to be flat with respect to the heat plate 102.

By the way, the heat plate 102 may be situated in a downflow environment of nitrogen or the like. In this case, the nitrogen flows inward from the circumference to the center of the substrate and thus into the suction conduits 106. Therefore, a large amount of nitrogen has to be evacuated in order to attract the substrate 103 onto the heat plate 102 (the pins 108). However, if the suction performance of, for example, the vacuum pump 107 is strengthened, an excessively large force may be locally applied to the substrate 103, resulting in damage to or breakage of the substrate 103 in some circumstances, as shown in FIG. 2C. Or, even if the substrate 103 is not damaged or broken, more time is required to attract the substrate 103, if the substrate 103 is severely warped. When it takes more time, the heat plate 102 is cooled for a longer time by the nitrogen flow, which may require more thermal energy to be supplied to the heat plate 102. In addition, when more time is needed to straighten the substrate 103, the temperature uniformity of the heat plate 102 may become worse because the heat plate 102 can be cooled unevenly by the nitrogen, which impairs the thermal process that should uniformly heat the substrate 103.

In addition, while volatile substances or the like, which may be caused by heating the substrate 103 and the film on the substrate 103, are mainly evacuated along with the nitrogen, for example, by an evacuation apparatus 110 and collected by a collecting portion 105, part of the substances may be evacuated through the suction conduits 106. The volatile substances flowing through the suction conduits 106 may be cooled to be condensed on the inside wall of the suction conduits 106, thereby narrowing the inner diameter of the suction conduits 106. As a result, the suction performance is impaired, so that the substrate 103 may no longer be attracted.

Patent Document 1 listed below discloses a technique in which a degree of substrate warpage is measured in advance and the suction performance or an amount of gas blown onto the substrate is adjusted between in the inner area and in the outer area of the heat plate in accordance with the measurement result so as to hold the substrate flat with respect to the heat plate. However, this technique cannot completely eliminate the above disadvantages because a large amount of gas may need to be suctioned from the suction conduits at the outer area, which may lead to damage in the substrate, although this technique is advantageous compared with a heat plate where the substrate is attracted entirely at the same suction performance.

In addition, Patent Document 2 discloses another technique that can reduce temperature variations throughout the substrate by substantially confining the air layer between the substrate and the heat plate so as to prevent air from flowing therebetween. While this technique may properly keep the substrate flat, it cannot be employed when the edge area of a back surface of the substrate is contaminated by a resist solution, since the contaminated edge area contacts a top surface of the heat plate so as to produce particles from the resist.

Patent Document 1: Japanese Patent Laid-Open Publication No. 2006-210400 (paragraph 0042 and 0045, FIGS. 6 and 7).

Patent Document 2: Japanese Patent Laid-Open Publication No. H06-338450 (paragraph 0027).

The present invention has been made in view of the above, and is directed to a substrate processing apparatus and method that can hold the substrate flat with respect to a heat exchanging plate of the substrate processing apparatus by suction and prevent an excessively large force being applied to the substrate.

SUMMARY OF THE INVENTION

A first aspect of the present invention provides a substrate processing apparatus adapted to heat and/or cool a substrate. The apparatus comprises a heat exchange plate configured to heat and/or cool the substrate; plural protrusions provided on the heat exchange plate so as to allow the substrate to be placed on the plural protrusions, leaving a gap between the substrate and the heat exchange plate; a suction portion configured to attract the substrate onto the plural protrusions by suction through plural holes formed in the heat exchange plate; and a partition member that is provided on the heat exchange plate and lower than the plural protrusions, wherein the partition member is configured to divide the gap into two or more regions including at least one of the holes so that at least one of the two or more regions is two-dimensionally closed by the partition member.

A second aspect of the present invention provides a substrate processing apparatus according to the first aspect, where the partition member divides the gap into the two or more regions so that the two or more regions are arranged in a radial direction.

A third aspect of the present invention provides a substrate processing apparatus according to the second aspect, where a part of the partition member is located along and substantially beneath a circumferential portion of the substrate to be placed on the plural protrusions.

A fourth aspect of the present invention provides a substrate processing apparatus according to any one of the first through the third aspects, where the heat exchange plate is configured to contain heat exchange elements corresponding to the two or more regions so as to independently control temperatures of the two or more regions.

A fifth aspect of the present invention provides a substrate processing apparatus according to any one of the first through the third aspects, further comprising a substrate warpage measurement unit that measures warpage of the substrate so as to generate information indicating at least warpage direction of the substrate, where the heat exchange plate is configured to contain heat exchange elements corresponding to the two or more regions so as to independently control temperatures of the two or more regions in accordance with the information.

A sixth aspect of the present invention provides a substrate processing apparatus according to any one of the first through the third aspects, further comprising a substrate warpage measurement unit that measures warpage of the substrate so as to generate information indicating at least warpage direction of the substrate, where the heat exchange plate is configured to contain heat exchange elements corresponding to the two or more regions so as to independently control temperatures of the two or more regions in accordance with the information, and wherein the suction portion is configured to include suction amount adjustment portions corresponding to the two or more regions so as to independently control suction amounts from the two or more regions in accordance with the information.

A seventh aspect of the present invention provides a substrate processing apparatus according to any one of the first through the fourth aspects, where the suction portion is configured to include suction amount adjustment portions corresponding to the two or more regions so as to independently control suction amounts from the two or more regions.

An eighth aspect of the present invention provides a substrate processing apparatus according to any one of the first through the fourth aspects, further comprising a substrate warpage measurement unit that measures warpage of the substrate so as to generate information indicating at least warpage direction of the substrate, where the suction portion is configured to include suction amount adjustment portions corresponding to the two or more regions so as to independently control suction amounts from the two or more regions in accordance with the information.

A ninth aspect of the present invention provides a substrate processing apparatus according to the fifth aspect, where the information further includes a degree of warpage of the substrate.

A tenth aspect of the present invention provides a substrate processing apparatus according to the eighth aspect, where the information further includes a degree of warpage of the substrate.

An eleventh aspect of the present invention provides a substrate processing method for heating and/or cooling a substrate. This method includes steps of placing the substrate on plural protrusions that are provided on a heat exchange plate so as to create a gap between the substrate and the heat exchange plate; attracting the substrate onto the plural protrusions by suction through two or more gap regions defined by dividing the gap using a partition member that is provided on the heat exchange plate and lower than the plural protrusions, at least one of the gap regions being two-dimensionally closed by the partition member, and heating and/or cooling the substrate attracted onto the plural protrusions through the two or more gap regions.

A twelfth aspect of the present invention provides a substrate processing method according to the eleventh aspect, where the partition member divides the gap into the two or more regions so that the two or more regions are arranged in a radial direction.

A thirteenth aspect of the present invention provides a substrate processing method according to the eleventh or the twelfth aspect of the present invention, where a part of the partition member is located substantially below and along a circumferential portion of the substrate to be placed on the plural protrusions.

A fourteenth aspect of the present invention provides a substrate processing method according to any one of the eleventh through the thirteenth aspects, where the step of heating and/or cooling independently heats and/or cools the two or more gap regions.

A fifteenth aspect of the present invention provides a substrate processing method according to the eleventh through the fourteenth aspects, further comprising a step of measuring warpage of the substrate so as to generate information indicating at least warpage direction of the substrate, where the step of heating and/or cooling independently controls temperatures of the two or more gap regions in accordance with the information.

A sixteenth aspect of the present invention provides a substrate processing method according to the eleventh through the fifteenth aspects, where the step of attracting attracts the substrate onto the plural protrusions with suction amounts corresponding to the two or more gap regions.

A seventeenth aspect of the present invention provides a substrate processing method according to the eleventh through the sixteenth aspects, further comprising a step of measuring warpage of the substrate so as to generate information indicating at least warpage direction of the substrate, where the step of attracting attracts the substrate onto the plural protrusions with suction amounts corresponding to the two or more gap regions in accordance with the information.

An eighteenth aspect of the present invention provides a substrate processing method according to the fifteenth aspect, where the information further includes a degree of warpage of the substrate.

A nineteenth aspect of the present invention provides a substrate processing method according to the seventeenth aspect, where the information further includes a degree of warpage of the substrate.

A twentieth aspect of the present invention provides a computer readable storage medium that stores a computer program for causing a substrate processing apparatus to heat and/or cool a substrate. This computer program includes steps of: placing the substrate on plural protrusions that are provided on a heat exchange plate so as to create a gap between the substrate and the heat exchange plate; attracting the substrate onto the plural protrusions by suction through two or more gap regions defined by dividing the gap using a partition member that is provided on the heat exchange plate and lower than the plural protrusions, at least one of the gap regions being two-dimensionally closed by the partition member, and heating and/or cooling the substrate attracted onto the plural protrusions through the two or more gap regions.

In the aspects of the present invention, the substrate is placed on the plural protrusions provided in the heat exchange plate and attracted by suction through the gap regions defined by dividing the gap caused between the substrate and the heat exchange plate using the partition member. The partition member is provided on the heat exchange plate so as to be lower than the plural protrusions, and two dimensionally enclose at least one of the gap regions. Due to such a configuration, the partition can reduce an amount of gas flowing into the gap regions from the outside of the heat exchange plate, which allows the substrate to be readily attracted onto the protrusions with a little suction force. Therefore, there is no need to enhance the suction performance of the suction apparatus, thereby preventing the substrate from being damaged or broken.

BRIEF DESCRIPTION OF THE DRAWINGS

Other objects, features and advantages of the present invention will become more apparent from the following detailed description when read in conjunction with the accompanying drawings, in which:

FIG. 10 is a schematic diagram of a substrate processing apparatus according to a third embodiment of the present invention;

FIG. 12 is a schematic diagram of a substrate processing apparatus configured by adding the warpage measurement apparatus to the substrate processing apparatus according to the second embodiment of the present invention;

DETAILED DESCRIPTION OF THE PREFERRED EMBODIMENT

Figure 1:
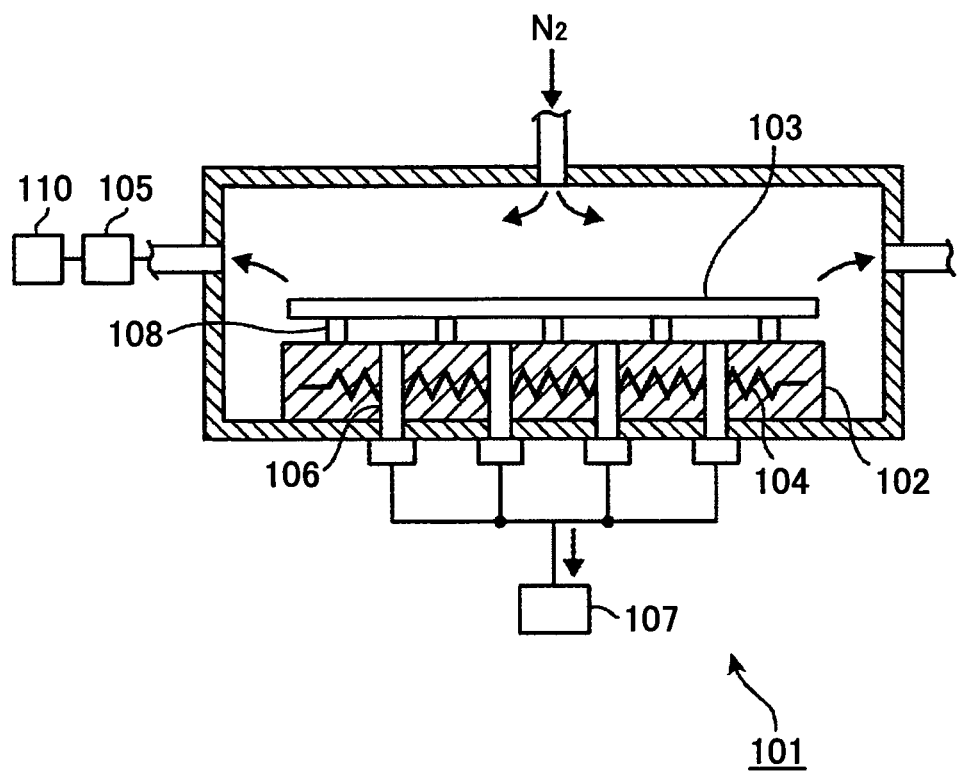
FIG. 1 is a cut-out side view of a related art heating apparatus.
Figure 2A:
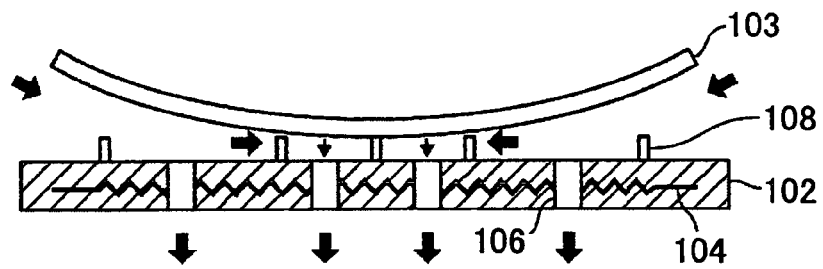
FIGS. 2A through 2C illustrate how a substrate is placed on a thermal plate provided in the heating apparatus shown in FIG. 1.
Figure 2B:
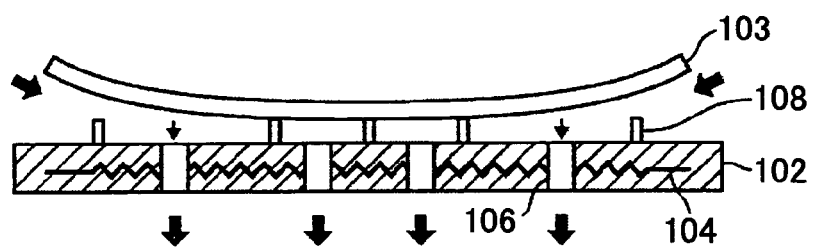
Figure 2C:
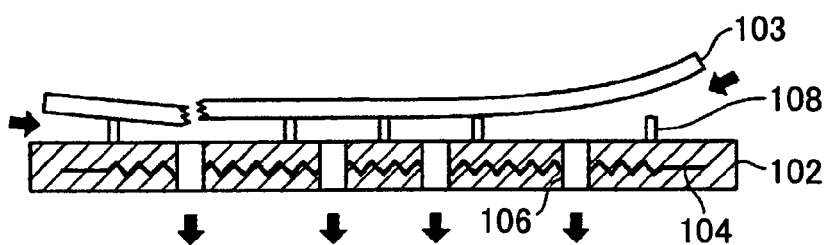

Referring to the accompanying drawings, a substrate processing apparatus according to exemplary embodiments of the present invention will be described. In the drawings, the same or corresponding reference marks are given to the same or corresponding members or components. It is to be noted that the drawings are illustrative of the invention, and there is no intention to indicate scale or relative proportions among the members or components. Therefore, the specific size should be determined by a person having ordinary skill in the art in view of the following non-limiting embodiments.

First Embodiment

A substrate processing apparatus according to a first embodiment of the present invention is preferably applicable to a coater/developer that spin-coats a film such as a resist film or the like on a substrate, for example, a semiconductor wafer (simply referred to as wafer W, hereinafter) and develops the spin-coated film.

Figure 3:
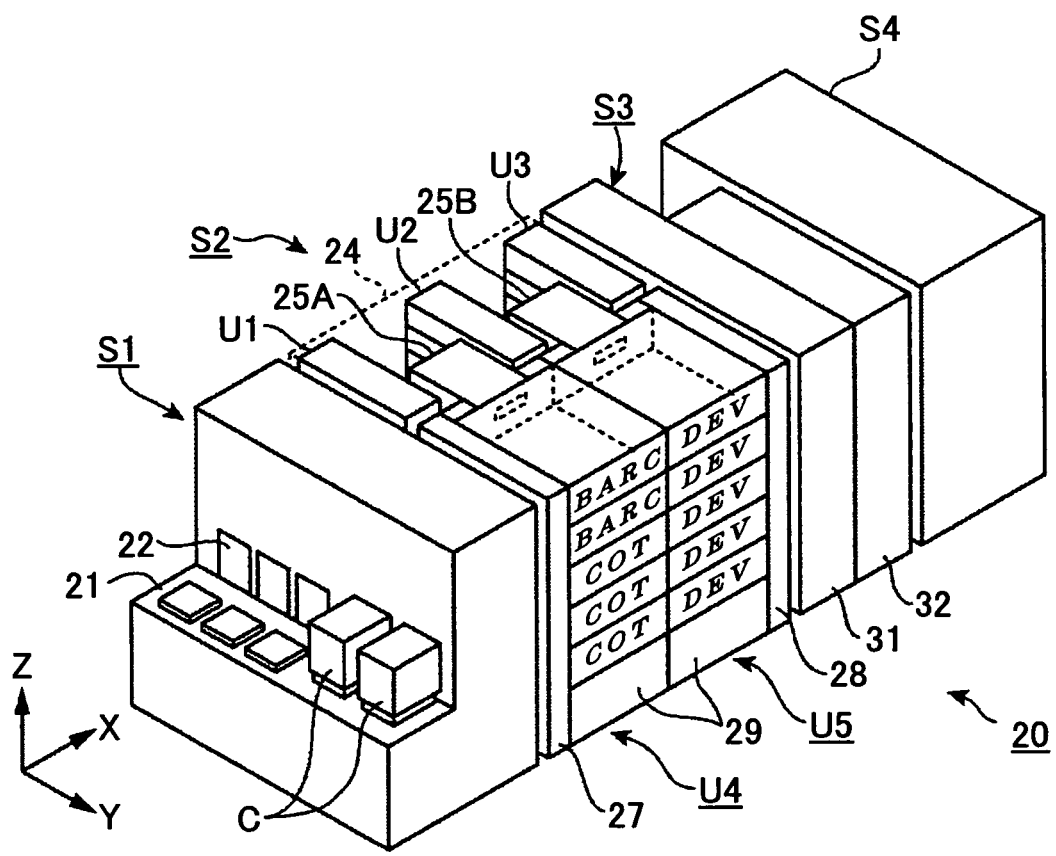
FIG. 3 is a perspective view of a coater/developer to which a substrate processing apparatus according to an embodiment of the present invention can be applied.
Figure 4:
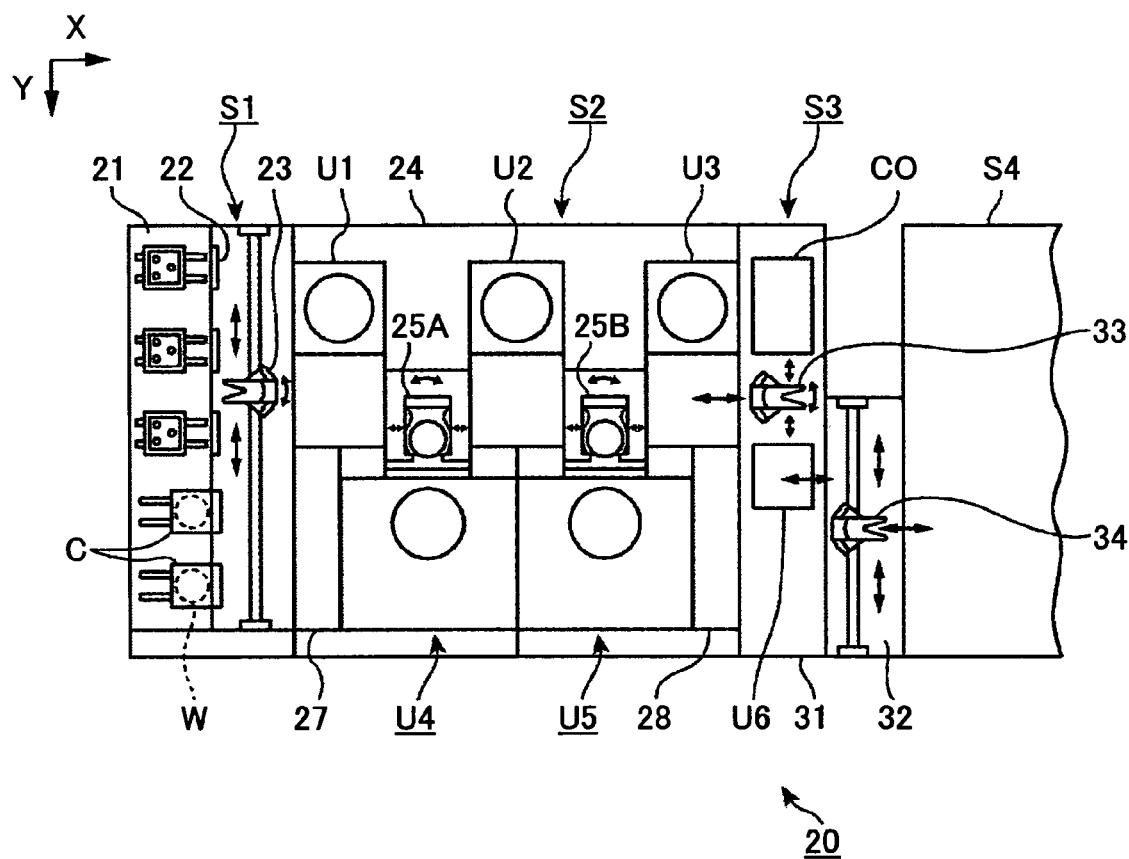
FIG. 4 is a cut-away top view of the coater/developer shown in FIG. 3.

First, a coater/developer 20 is described in reference to FIGS. 3 and 4. As shown, the coater/developer 20 includes a cassette stage portion Si for transferring wafers W (FIG. 4) in a substrate cassette C. The cassette stage portion S1 has a substrate cassette stage 21 on which plural substrate cassettes C can be placed, doors 22 corresponding to the plural substrate cassettes C placed on the substrate cassette stage 21, and a transfer mechanism 23 that transfers the wafers W from/to the substrate cassettes through the doors 22. By the way, each of the substrate cassettes C can house plural wafers, for example, 13 wafers.

In addition, the coater/developer 20 includes a process portion S2 enclosed by a chassis 24 next to the cassette stage portion S1. As shown in FIG. 4, in the process portion S2, a shelf unit U1, a main transfer portion 25A, a shelf unit U2, a main transfer portion 25B, and a shelf unit U3 are arranged in this order from the front to the back of the process portion S2.

In other words, the shelf units U1 through U3 and the main transfer portions 25A and 25B are arranged alternately along an X direction in FIG. 4 in the process portion S2.

Each of the shelf units U1 through U3 has multi-stage (e.g., 10-stage) heating and/or cooling units to be used to perform pre- and post-processes prior to liquid treatments performed in liquid treatment units U4, U5 (described later). In each of the multi-stage units U1 through U3 is included a substrate processing apparatus 2 (described later).

In addition, the main transport portions 25A and 25B transport the wafer W between the shelf units U1 through U3 and various process units including coat/development units. The shelf units U1 through U3 and the main transfer portions 25A and 25B have openings (not shown) through which the wafer W can be transferred from the shelf unit U1 through the shelf unit U3 in the process portion S2.

The main transfer portion 25A is located so as to be surrounded by the shelf unit U1, a liquid treatment unit U4, and the shelf unit U2. Similarly, the main transfer portion 25B is located so as to be surrounded by the shelf unit U2, a liquid treatment unit U5, and the shelf unit U3. The liquid treatment units U4, U5 have a storage portion 29 which is allocated as a storage space for resist solution, developing solution, or the like, and multi-stage, for example, five-stage units including a coater unit COT, a developer unit DEV, an anti-reflection film forming unit BARC, and the like located on top of the storage portion 29. By the way, next to the liquid treatment unit U4 (U5) is provided a temperature/humidity control unit 27 (28) that includes a temperature controller for the solutions used in the liquid treatment unit U4 (U5), a duct to be used for controlling temperature and humidity, and the like.

Next to the process portion S2 along the positive X direction in FIGS. 3 and 4, an interface portion S3 is provided so that the process portion S2 is flanked by the cassette stage portion S1 and the interface portion S3. The interface portion S3 has a first transfer chamber 31 and a second transfer chamber 32. While one side of the second transfer chamber 32 is connected to the first transfer chamber 31, the other side of the second transfer chamber 32 is connected to an exposure portion S4 including an exposure apparatus. The interface portion S3 is provided with two transfer mechanisms 33, 34 for transferring the wafer W between the process portion S2 and the exposure portion S4, a shelf unit U6, and a buffer cassette C0.

In the above coater/developer 20, the wafer is processed in the following manner. First, the substrate cassette C housing the wafers W is placed on the substrate cassette stage 21. Next, a lid of the substrate cassette C is opened; the door 22 corresponding to this substrate cassette C is opened; and thus the wafer W is taken out by the transfer mechanism 23 from the substrate cassette C. Then, the wafer W is handed over to the main transfer portion 25A via a transfer unit (not shown) which is one of the stages in the shelf unit U1. In one of the stages in the shelf units U1 through U3, the wafer W undergoes a pre-treatment such as a hydrophobizing process, a cooling process, or the like and then a resist film is spin-coated on the treated wafer W in the coater unit COT. The coated wafer W is heated in the heating unit (substrate processing apparatus 2), which is one of the stages in each of the shelf units U1 through U3, and then cooled. Next, the cooled wafer W is transferred into the interface portion S3 via a transfer unit of the shelf unit U3. In the interface portion S3, the wafer W is transferred from a transfer mechanism 33 to the exposure portion S4 via, for example, the shelf unit U6 and the transfer mechanism 34, and then the exposing process is performed on the wafer W in the exposure portion S4. After the exposure, the wafer W is transferred to the shelf unit U3 along a route opposite to the route along which the wafer W is transferred from the shelf unit U3 to the exposure portion S4, and heated and cooled in the shelf unit U3. Then, the wafer W is transferred to one of the developing units DEV by the main transfer portion 25B, and the resist film on the wafer W is developed so that a resist mask is formed in the developing unit DEV. Finally, the wafer W is returned back to the original substrate cassette C on the substrate cassette stage 21.

Figure 5:
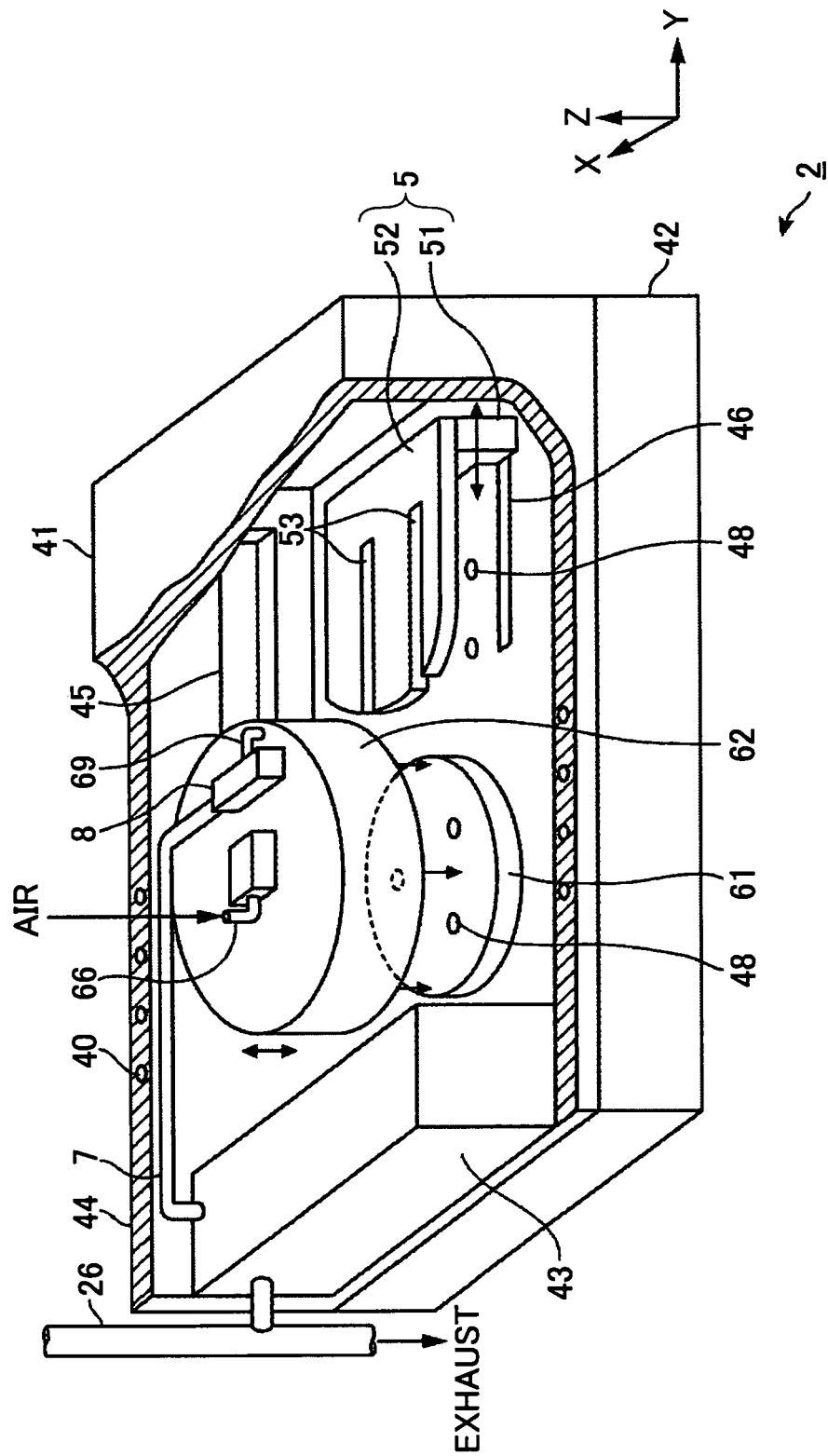
FIG. 5 is a perspective view of a substrate processing apparatus according to an embodiment of the present invention.

Next, a primary portion of the substrate processing apparatus 2 according to the embodiment of the present invention is described in reference to FIGS. 5 through 7B. The substrate processing apparatus 2 is enclosed by a chassis 41 made of, for example, aluminum as shown in FIG. 5 and configured as one of the stages of each of the shelf units U1 through U3, as stated above. The chassis 41 is placed on a stage 42. Inside the chassis 41, there is a chamber 43 that houses members or components of an exhaust system at the farthest portion in a negative Y-direction (FIG. 5). In addition, in one of side walls 44 of the chassis 41, an opening 45 is formed through which the wafer W can be transferred into and out from the chassis 41. An openable/closable shutter (not shown) is provided for the opening 45. Moreover, plural coolant conduits 40 run in a vertical direction inside a center portion of the side wall 44. Through the coolant conduits 40, cooling water is supplied from a housing portion (not shown) located below the shelf unit U1 (U2, U3) so as to control the temperature inside the chassis 41.

On a top surface of the stage 42, there are arranged a thermal plate 61 serving as a thermal exchange plate and a cooling arm 5 in this order along the positive Y direction in FIG. 5. The cooling arm 5 has a foot portion 51 movable along a guide 46 extending in the Y direction on the stage 42, and a wafer supporting plate 52 attached on the foot portion 51 so as to be substantially in parallel with the top surface of the stage 42. With this configuration, the cooling arm 5 can reciprocally move in the Y direction between a standby position, which is next to the opening 45, and a position above the thermal plate 61. Therefore, the cooling arm 5 can receive the wafer W from the main transfer portion 25A (25B) that enters the chassis 41 through the opening 45 and transfer the wafer W above the thermal plate 61. In addition, the wafer supporting plate 52 of the cooling arm 5 has on its back side a conduit (not shown) through which temperature controlling fluid such as purified water (deionized water) can flow, so that the wafer W is cooled to a temperature that can be readily handled by the thermal plate 61.

Figure 6:
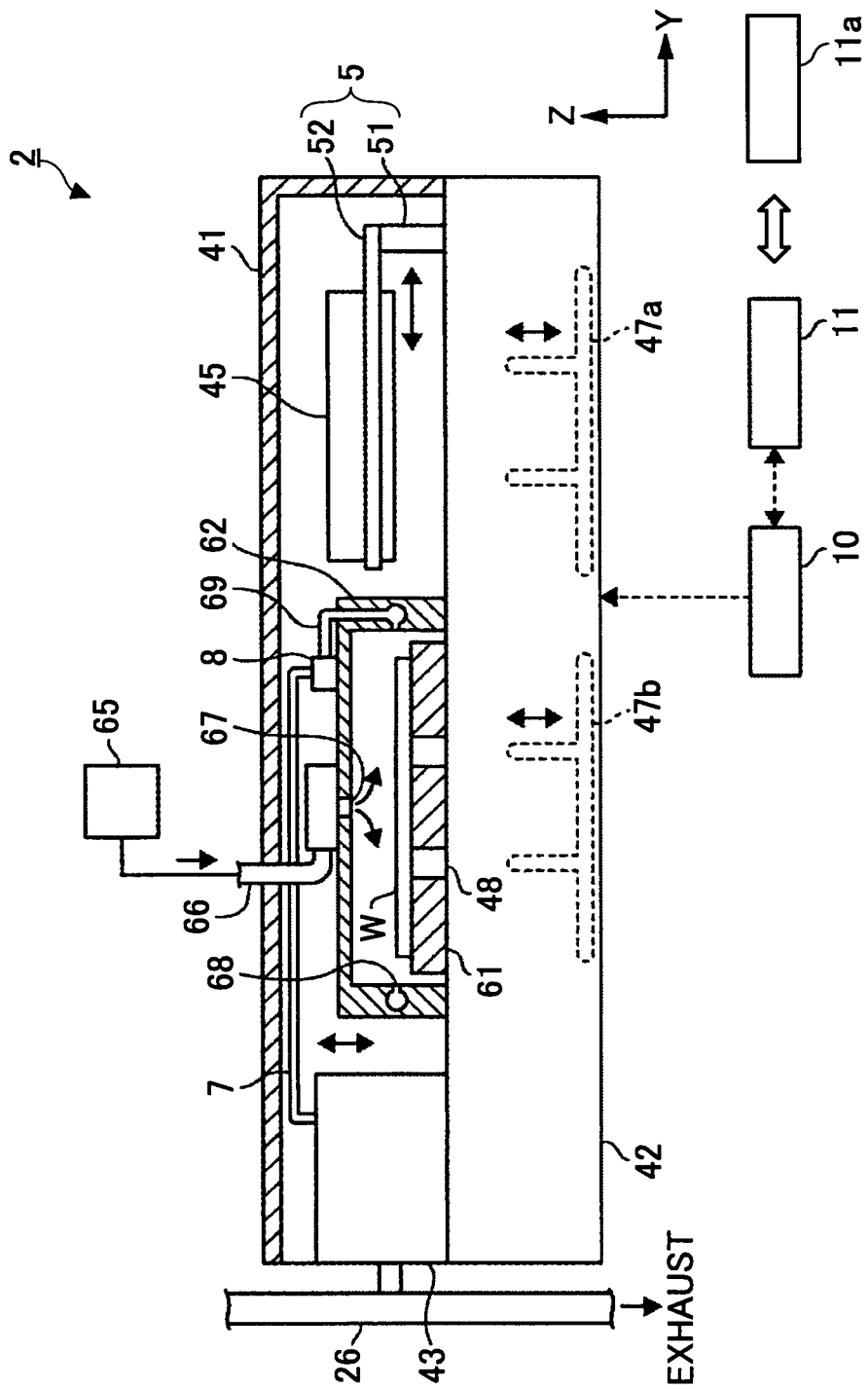
FIG. 6 is a cut-away side view of the substrate processing apparatus shown in FIG. 5.

In the stage 42, there are provided plural supporting pins 47a below the standby position of the wafer supporting plate 52 and plural supporting pins 47b below the thermal plate 61 (FIG. 6). These supporting pins 47a, 47b are vertically movable so as to protrude upward from the top surface of the stage 42 via through holes 48 and recede below the top surface of the stage 42. In addition, the wafer supporting plate 52 of the cooling arm 5 has slits 53 so that the supporting pins 47a can protrude upward through the slits 53.

Next, peripheral members or components to the primary portion of the substrate processing apparatus 2 according to this embodiment of the present invention are described. Above the thermal plate 61, there is provided a lid body 62 that is elevatable by an elevating mechanism (not shown). The lid body 62 can be brought down so as to enclose the thermal plate 61, as shown in FIG. 6, in an air-tight manner cooperatively with a sealing member (not shown) arranged on the stage 42.

An opening 67 is formed at substantially the center of a ceiling of the lid body 62. To the opening 67 is connected a supplying pipe 66 and to the supplying pipe 66 is connected a gas supplying source 65. With such a configuration, gas such as air, nitrogen, or the like can be supplied from the gas supplying source 65 toward the wafer W on the thermal plate 61 through the supplying pipe 66. In a side wall of the lid body 62, there are formed plural holes 68 along the inner wall of the lid body 62 at the same height as the wafer W on the thermal plate 61 when the lid body 62 is brought down (see FIG. 6). These plural holes 68 are in communication with an exhaust pipe 7 via an exhaust conduit 69 and a collection portion 8, which can exhaust the gas (air, nitrogen, or the like) supplied into the air-tight environment surrounding the wafer W from the gas supplying source 65 and the volatile substances from the wafer W. The collection portion 8 has, for example, a filter therein so as to collect the volatile substances. In addition, the exhaust pipe 7 is connected on the other end to an exhaust flow rate controlling member (not shown) in the housing chamber 43 and thus to a common exhaust line 26 that is shared by the shelf units U1, U2, U3.

Figure 7A:
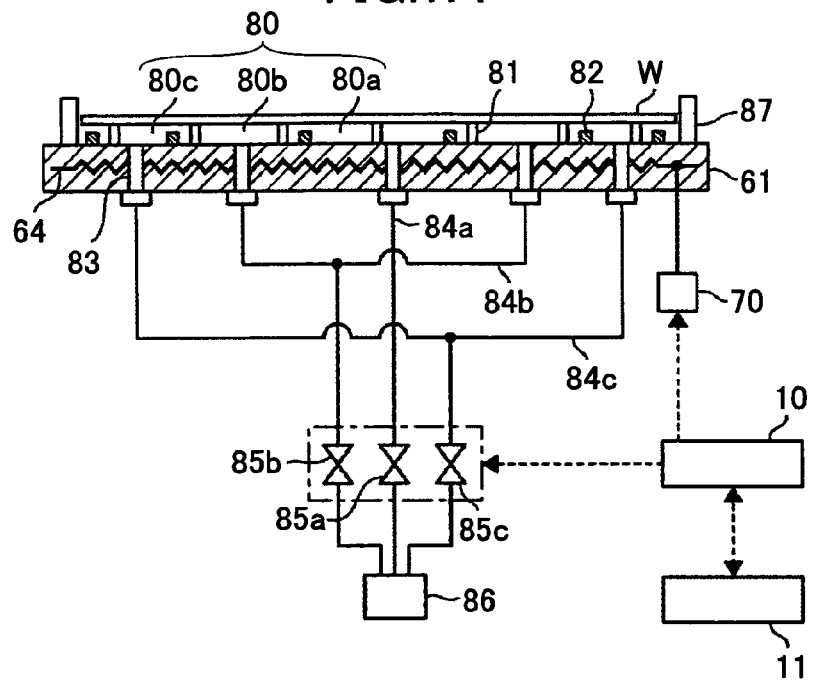
FIG. 7A is an explanatory diagram of an example of a thermal plate provided in the substrate processing apparatus shown in FIG. 5.
Figure 7B:
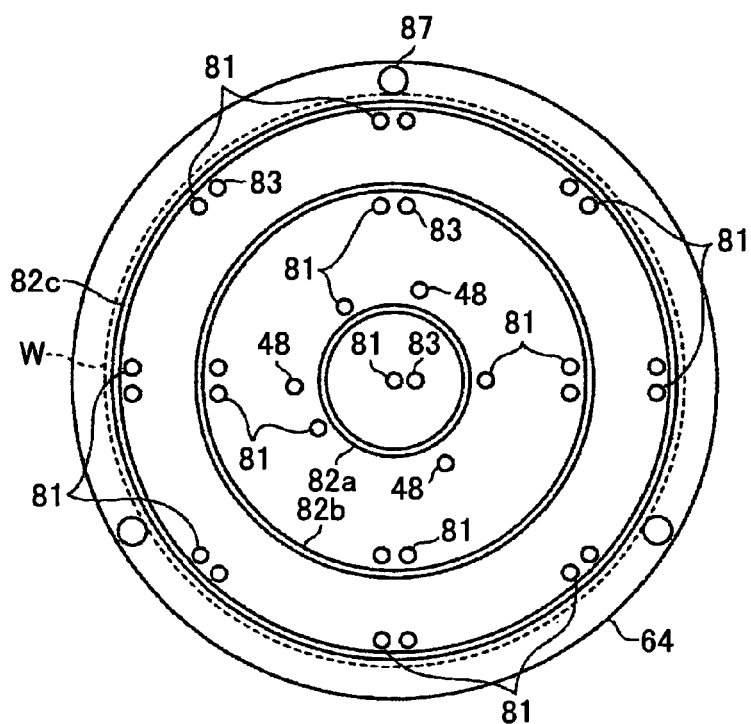
FIG. 7B is a plan view of the thermal plate shown in FIG. 7A.

Next, the thermal plate 61 is described in detail in reference to FIG. 7A and 7B. The thermal plate 61 is made of, for example, aluminum nitride and contains inside a heater 64 as a heat exchange portion for heating the wafer W. The heater 64 is electrically connected to an electric power source 70. Although not shown, the heater 64 is divided into plural zones and the temperature in each zone may be independently controlled. On the top surface of the thermal plate 61, plural protrusions 81 that protrude like pins at substantially the same height are formed so as to support the wafer W keeping gaps 80 of, for example but not limited to, about 0.3 mm between the wafer W and the top surface of the thermal plate 61. The gaps 80 are evacuated by a suction apparatus (described later) so as to keep suction on the wafer W. The protrusions 81 are distributed at substantially the same intervals on the top surface of the thermal plate 61 so as to evenly support the wafer W on the thermal plate 61 (protrusions 81).

In addition, a partition 82 is attached on the top surface of the thermal plate 61 as shown in FIG. 7A. The partition 82 is composed of three rings, namely, an innermost ring 82a, a middle ring 82b, and an outermost ring 82c that have different diameters and are arranged concentrically with one another. The partition 82 divides the gap 80 into three gap regions 80a, 80b, 80c in the radial direction. The partition 82 is 50-60% lower than the height of the protrusions 81 so as to prevent the wafer W from touching the partition 82. In order to be certain to avoid the wafer W touching the partition 82 even when the wafer W is or becomes slightly warped into a bowl shape, the protrusions 81 are located near the partition 82. In the illustrated example in FIG. 7B, one protrusion 81 is located inside the innermost ring 82a; three protrusions 81 are located near and outside the innermost ring 82a; four protrusions 81 are located near and inside the middle ring 82b; and eight protrusions 81 are located near and inside the outermost ring 82c.

By the way, when a resist film is formed on the top surface of the wafer W, the resist film may be extended around to the back circumferential portion of the wafer W. In order to prevent the outermost protrusions 81 from touching the resist film on the back circumferential portion, the protrusions 81 are located about 3 mm inside the edge of the wafer W.

In addition, the thermal plate 61 includes plural suction holes 83. These suction holes 83 are located near the protrusion 81 in the gap region 80a, the protrusions 81 in the gap region 80b, and the protrusions 81 in the gap region 80c, as shown in FIG. 7B. The gap regions 80a, 80b, 80c are evacuated by a suction apparatus 86 such as a vacuum pump via the suction holes 83, suction pipes 84a, 84b, 84c and valves 85a, 85b, 85c, respectively (FIG. 7A), thereby serving as a suction region.

Moreover, there are provided three guides 87 on the top circumferential area of the thermal plate 61. The guides 87 serve to position the wafer W on the thermal plate 61 (protrusions 81). In other words, the wafer W is brought down on the thermal plate 61 (protrusions 81) so that the edge of the wafer W slides on the guides 87. By the way, the holes 48 for the supporting pins 47b are not shown for simplicity of illustration in FIG. 7A.

Referring to FIG. 6, a controlling portion 10 composed of, for example, a computer is connected to the substrate processing apparatus 2, to which controlling portion 10 a storage portion 11 is in turn connected. The storage portion 11 stores a program that has originally been saved in a computer readable storage medium 11a, such as a hard disk, a CD-ROM/RAM, a magneto-optical disk, various memory cards, a USB memory, or the like. The program includes steps (instructions) of causing each element of the substrate processing apparatus 2 to perform a predetermined thermal process, e.g., heating the wafer W, attracting the wafer W, and the like, described later.

In the substrate processing apparatus 2, the wafer W is processed in the following manner. First, after the shutter (not shown) to the opening 45 is opened, the wafer W on which the resist film has been spin-coated in the coater unit COT is transferred into the chassis 41 through the opening 45 by the main transfer portion 25A (25B). When the wafer W is brought above the cooling arm 5 (or to the standby position of the cooling arm 5), the supporting pins 47a are raised so as to receive the wafer W from the main transfer portion 25A (25B), the main transfer portion 25A (25B) is withdrawn from the chassis 41, and then the supporting pins 47a are lowered so as to place the wafer W on the wafer supporting plate 52 of the cooling arm 5. Next, the cooling arm 5 brings the wafer W above the thermal plate 61 while the lid body 62 is kept higher above the thermal plate 5. Then, the supporting pins 47b, which have been brought down below the thermal plate 61, are raised so as to receive the wafer W; the cooling arm 5 goes back to the idle position; and then the supporting pins 47b are lowered so as to bring down the wafer W along the guides 87, which thus places the wafer W in a proper position on the thermal plate 61. At this time, the heater 64 is set at a predetermined temperature of, for example, 120° C. so as to heat the thermal plate 61 at substantially the same temperature. After the wafer W is placed on the thermal plate 61, the following procedure is carried out.

The lid body 62 is lowered so as to maintain airtightness around the wafer W, the thermal plate 61, and the surrounding environment. Next, predetermined gas, for example, air is supplied at a predetermined flow rate from the gas supplying apparatus 65 into the interior of the lid body 62 through the supplying pipe 66, and then exhausted through the holes 68, the exhaust conduit 69, the collection portion 8, or the like to the common exhaust line 26. With this, the ambient atmosphere inside the lid body 62 is purged. Then, the wafer W on the thermal plate 61 (protrusions 81) is attracted toward the top surface of the thermal plate 61 by the suction apparatus 86 through the suction pipes 84a, 84b, 84c and the gap regions 80a, 80b, 80c.

Figure 8A:
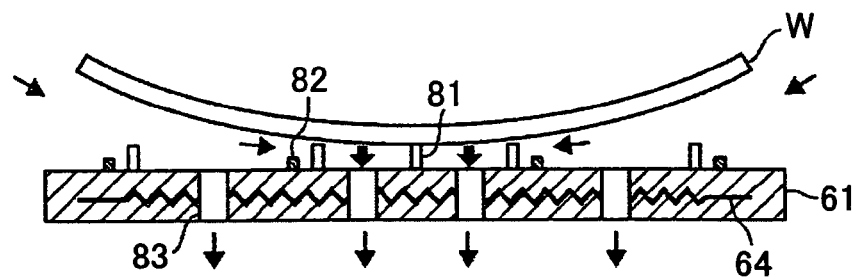
FIGS. 8A through 8C show how a substrate is placed on the thermal plate shown in FIG. 7.
Figure 8B:
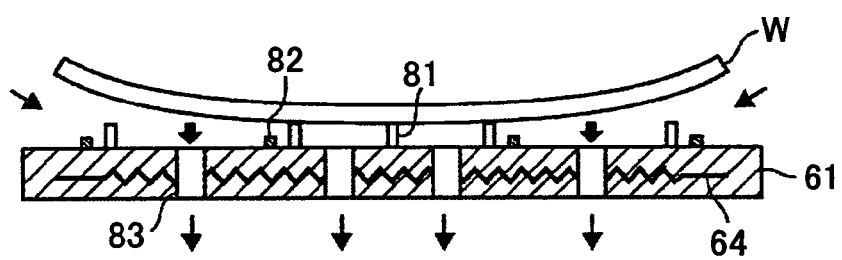
Figure 8C:
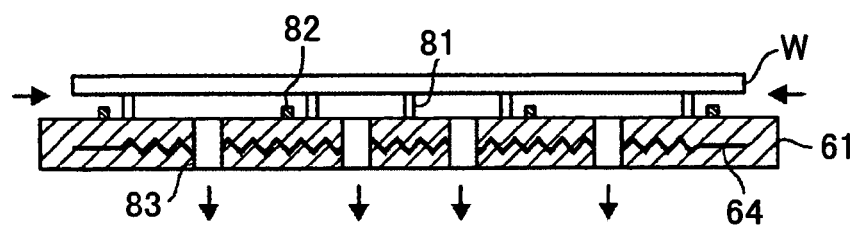

Referring to FIGS. 8A through 8C in addition to FIGS. 7A and 7B, there is described the way that the concavely warped wafer W is suctioned onto the thermal plate 61. The concavely warped wafer W contacts a substantially center portion of the back surface the protrusion 81 located at the center of the thermal plate 61, as shown in FIG. 8A. When the gap regions 80a, 80b, 80c are evacuated, the wafer W comes in contact with the protrusions 81 respectively from the center portion to the peripheral portion. This is specifically described in the following. Since there is only a narrow gap between the back surface of the wafer W and the top end of the inner ring 82a, only a small amount of the air can flow into the gap region 80a from outside. Therefore, the pressure in the gap region 80a readily becomes lower than the atmospheric pressure, thereby attracting the wafer W downward so that the back surface of the wafer W comes in contact with the protrusions 81 next to the center protrusion 81, as shown in FIG. 8B. With this, the back surface of the wafer W comes closer to the top end of the middle ring 82b (FIG. 7B). Therefore, only a small amount of air can flow into the gap region 80b from outside. Thus, the pressure in the gap region 80b readily becomes lower than the atmospheric pressure, thereby attracting the wafer W downward so that the back surface of the wafer W comes in contact with the protrusions 81 near the middle ring 82b (FIG. 7B). Similarly, the back surface of the wafer W comes closer to the top end of the outermost ring 82c (FIG. 7B). Therefore, only a little amount of air can flow into the gap region 80c from outside. Thus, a pressure in the gap region 80c readily becomes lower than the atmospheric pressure, thereby attracting the wafer W downward so that the back surface of the wafer W comes in contact with all the protrusions 81 on the thermal plate 61, as shown in FIG. 8C. As stated, the rings 82a, 82b, 82c serve to prevent the gas (or air) from flowing through between the back surface of the wafer W and the top surface of the thermal plate 61. By the way, a part of the partition 82 and protrusions 81 are omitted in FIG. 8A through 8C, for simplicity of illustration.

When a predetermined period of time, for example, about 90 seconds, have elapsed while the wafer W is kept flat on the thermal plate 61 (protrusions 81), evacuating the gap regions 80a, 80b, 80c is stopped and the wafer W is transferred from the thermal plate 61 to the cooling arm 5 and thus to the main transfer portion 25A (25B) in the opposite manner compared to when the wafer W is transferred onto the thermal plate 61 from the main transfer portion 25A (25B). By the way, when the wafer W is thermally processed, the gas exhausted from the holes 68 is filtered by the collection portion 8 so that sublimated substances from the resist film or the like contained in the exhausted gas are collected by the collection portion 8, and the gas excluding such substances is exhausted from the common exhaust line 26.

Then, the subsequent wafers W are transferred into the chassis 41 one by one and the above procedures are repeated on each of the wafers W.

According to the above embodiment of the present invention, the gap 80 caused by the protrusions 81 between the wafer W and the thermal plate 61 is divided into the gap regions 80a, 80b, 80c by the partition 82 including the rings 82a, 82b, 82c having different diameters arranged concentrically on the thermal plate 61, and each of the gap regions 80a, 80b, 80c is separately evacuated. Since the partition 82 may reduce the amount of air flowing into the gap regions 80a, 80b, 80c, the gap regions 80a, 80b, 80c can readily be at a reduced pressure so as to attract the entire wafer onto the protrusions 81 even if the suction performance of the suction apparatus 86 is not enhanced. Since there is no need for enhancing the suction performance, no excessive force is locally applied to the wafer W, thereby preventing the wafer from being damaged or broken. In addition, since the amount of the air flowing into the suction tubes 84a, 84b, 84c or the like is also reduced, the amount of volatile substances flowing into the suction tubes 84a, 84b, 84c or the like is also reduced. Therefore, such substances are not condensed on the inner surface of the suction tubes 84a, 84b, 84c or the like so as to clog the suction tubes 84a, 84b, 84c or the like, thereby avoiding degraded suction performance and reducing the frequency of cleaning the suction tubes 84a, 84b, 84c or the like.

In addition, when the concavely warped wafer W is placed on the thermal plate 61 (protrusions 81), the shape of the wafer W is made flat with the thermal plate 61 in a stepwise manner from the center portion to the circumferential portion. In other words, the wafer W is first attracted by the gap region 80a, then by the gap region 80b, and finally by the gap region 80c. Moreover, suction at each step can be carried out in a short period, thereby reducing the period of time necessary for maintaining the wafer W to be flat as a whole with respect to the thermal plate 61. Therefore, the wafer W can be heated uniformly, thereby improving temperature uniformity over the wafer W. Besides, this is true for each wafer among plural wafers W to be processed by the substrate processing apparatus 2 according to this embodiment of the present invention, thereby improving wafer-to-wafer repeatability in terms of temperature uniformity.

As clearly understood from the experiment results described below, the amount of air suctioned so as to attract the wafer W onto the thermal plate 61 (protrusions 81) can be reduced to an about 25% level when the partition 82 (the rings 82a, 82b, 82c) is placed, compared to when the partition 82 is not placed, on the thermal plate 61.

Furthermore, since the rings 82a, 82b, 82c are lower than the protrusions 81 and located near the protrusions 81, the wafer W does not touch the rings 82a, 82b, 82c even if the wafer W is warped concavely (in a bowl shape), thereby reducing particles that could be attached on the back surface of the wafer W. Even if the gap regions 80a, 80b, 80c are not completely sealed and adjacent two gaps among the gap regions 80a, 80b, 80c are in communication with each other, since the amount of the air flowing inward from outside can be reduced by the rings 82a, 82b, 82c, the aforementioned effects are demonstrated. In addition, the gap regions 80a, 80b, 80c are mutually in communication, so that the reduced pressure applied to the wafer W is evenly distributed over the wafer W. This is advantageous in that no excessive pressure is locally applied to the wafer W, thereby avoiding wafer damage or breakage.

By the way, while the focus is on the concavely warped wafer W in the illustrated example, even the convexly warped wafer W can be kept flat with respect to the thermal plate 61, according to the substrate processing apparatus 2 according to this embodiment of the present invention.

Second Embodiment

Figure 9:
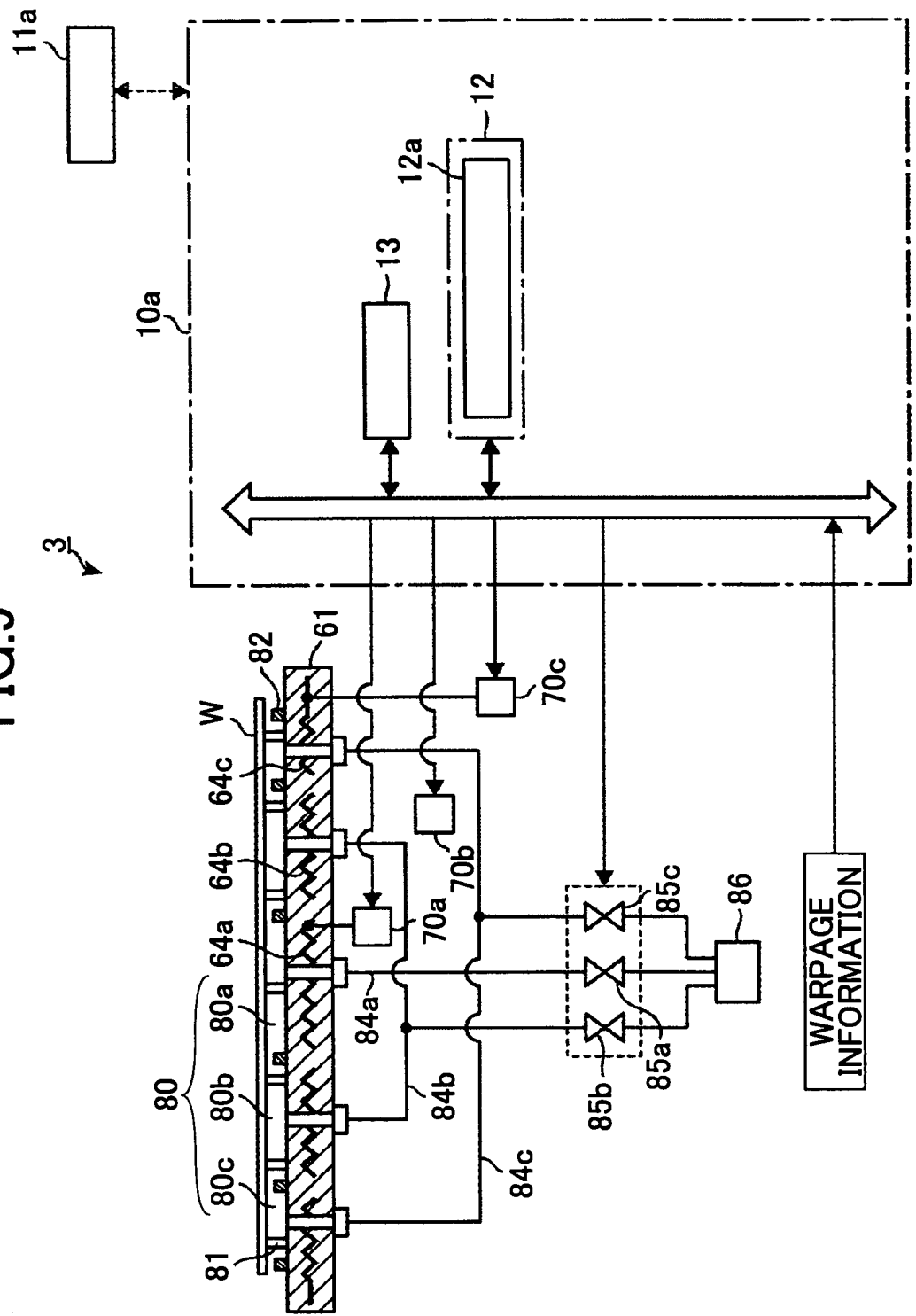
FIG. 9 is a schematic diagram of a substrate processing apparatus according to a second embodiment of the present invention.

Next, a substrate processing apparatus according to a second embodiment of the present invention is described in reference to FIG. 9. A substrate processing apparatus 3 according to the second embodiment of the present invention is different from the substrate processing apparatus 2 according to the first embodiment of the present invention in that the thermal plate 61 contains three heaters 64a, 64b, 64c which are connected to corresponding power sources 70a, 70b, 70c. The heaters 64a, 64b, 64c are arranged so as to correspond to the gap regions 80a, 80b, 80c.

In addition, the substrate processing apparatus 3 includes a control portion 10a having a CPU 13 and a program 12. The program 12 includes a temperature control program 12a that controls outputs from the power sources 70a, 70b, 70c. As already described in reference to FIGS. 8A through 8C, the lowest portion of the wafer W first contacts the protrusions 81; a portion surrounding the contact portion then comes to contact the protrusions 81; and finally the circumferential area of the wafer W contacts the protrusions 81. Since the wafer W is finally kept flat with respect to the thermal plate 61 in such a stepwise manner, there really is a time difference, even if only short interval, from when the lowest portion of the wafer W contacts the protrusions 81 to when the circumferential portion of the wafer W contacts the protrusions 81. Namely, the lower portion contacts the protrusions 81 for a longer time than does the circumferential area, which may cause temperature variations over the wafer W. However, the temperature uniformity over the wafer W can be improved by the substrate processing apparatus 3 according to the second embodiment of the present invention. Specifically, the temperatures in the corresponding gap regions 80a, 80b, 80c are controlled in accordance with warpage information in the substrate processing apparatus 3, thereby improving temperature uniformity over the wafer W.

The warpage information is derived from process history information about what kind of processes are performed and what kind of materials (a type of photoresist, or the like) are used on the wafer W prior to the wafer W reaching the substrate processing apparatus 3. Based on the history information, whether the wafer W will be warped concavely or convexly can be predicted so as to be included in the warpage information and the heaters 64a, 64b, 64c are controlled in accordance with the warpage information. By the way, the warpage information may include not only warpage directions (concavely or convexly) but also a degree of warpage, if predictable based on the history information.

For example, when the wafer W is concavely warped (or warped into a bowl shape) as shown in FIG. 8A, since the center portion of the wafer W tends to be heated to a higher temperature than other portions, the temperatures of the heaters 64a, 64b, and 64c are set at 90.0, 90.3, and 90.5° C., respectively, so that the temperature of the thermal plate 61 is gradually increasing from the center to the edge.

On the other hand, when the wafer W is convexly warped (or warped into a dome shape), the heaters 64a, 64b, 64c are set so that the temperature of the thermal plate 61 is gradually increasing from the edge to the center. When the wafer W is not warped, the heaters 64a, 64b, 64c are set so that the temperature of the thermal plate 61 is the same throughout the thermal plate 61.

The substrate processing apparatus 3 according to the second embodiment of the present invention can demonstrate the same effects as the substrate processing apparatus 2 according to the first embodiment, and improve the temperature uniformity over the entire wafer W in addition to the effects.

Third Embodiment

Next, a substrate processing apparatus according to a third embodiment of the present invention is described in reference to FIG. 10. Although the suctioned amounts in the gap regions 80a, 80b, 80c are not controlled in the previous embodiments of the present invention, the suctioned amounts are controlled in the substrate processing apparatus according to this embodiment of the present invention.

As shown in FIG. 10, a substrate processing apparatus 4 according to the fourth embodiment of the present invention includes flow rate controllers 71a, 71b, 71c between the suction apparatus 86 and the valves 85a, 85b, 85c, respectively. The flow rate controllers 71a, 71b, 71c control the amounts of air suctioned from the gap regions 80a, 80b, 80c, respectively, by the suction apparatus 86. By the way, the valves 85a, 85b, 85c and the flow rate controllers 71a, 71b, 71c constitute a flow rate controlling portion 73.

The substrate processing apparatus 4 includes a controlling portion 10b that has the CPU 13 and a program 14. The program 14 includes a suction amount controlling program 14a that causes the flow rate controlling portion 73 to control the amount of the air suctioned by the suction apparatus 86 in accordance with the warpage information. The suction amounts from corresponding gap regions 80a, 80b, 80c are controlled depending on the wafer warpage directions and/or the degree of warpage. With such a configuration, the wafer W can be heated more uniformly.

For example, when the wafer W is concavely warped as shown in FIG. 8A, the flow rate controlling portion 73 may control the suction amounts from the corresponding gap regions 80a, 80b, 80c so that a greater amount of air is suctioned from the gap region 80c than the other gap regions 80b, 80c. Therefore, the wafer W may be attracted onto the thermal plate 61 (protrusions 81) at substantially the same time for the center portion and the circumferential portion of the wafer W.

On the other hand, when the wafer W is convexly warped, a greater amount of air may be suctioned from the gap region 80a than the other gaps 80b, 80c. When the wafer W is not warped, the suction amounts from the gap regions 80a, 80b, 80c may be the same.

According to the substrate processing apparatus 4 according to the third embodiment of the present invention, the same effects as the substrate processing apparatus 2 according to the first embodiment can be demonstrated. In addition, since the suction amounts are controlled in accordance with the warpage directions and/or the degree of warpage of the wafer W, the wafer W can be readily kept flat with respect to the thermal plate 61, thereby improving the temperature uniformity over the wafer W.

It should be noted that both the temperatures of the heaters 64a, 64b, 64c and the amounts of the air suctioned from the corresponding gap regions 80a, 80b, 80c may be controlled in accordance with the warpage information. In other words, a combination of the substrate processing apparatuses 3, 4 may be practiced. This improves further the temperature uniformity over the wafer W.

Fourth Embodiment

Figure 11A:
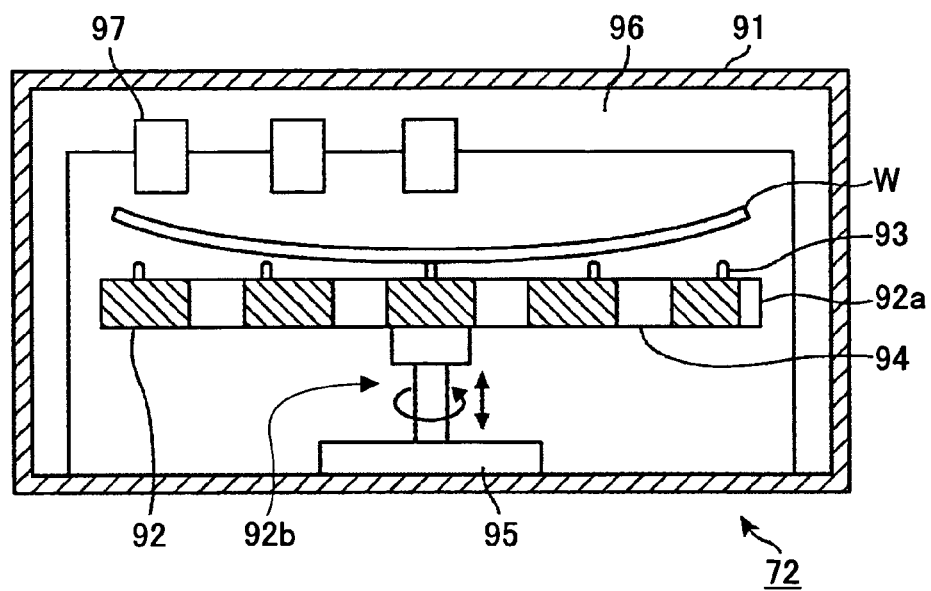
FIG. 11A is a cut-away side view of a warpage measurement unit preferably applied to a substrate processing apparatus according to an embodiment of the present invention.

Next, a fourth embodiment of the present invention is described in reference to FIGS. 11A through 12. In this embodiment, there is described a substrate processing apparatus which is substantially the same as the substrate processing apparatus 3 (4) according to the second (third) embodiment of the present invention and to which a warpage measurement unit is added. In the fourth embodiment of the present invention, the degree of warpage can be measured and the measured degree of warpage is used to control the temperature of the thermal plate 61 and/or the suction amounts from the gap regions 80a, 80b, 80c, although the warpage information derived from the process history information about the previous processes performed and materials used on the wafer W prior to the wafer W reaching the substrate processing apparatus 3 (4) is used in the second (the third) embodiment.

FIG. 11A shows a warpage measurement unit that can be added to the substrate processing apparatuses according to the forgoing embodiments of the present invention. As shown, the warpage measurement unit 72 includes a chassis 91 and a stage 92 on which the wafer W is placed. On the top surface of the stage 92, plural pins 93 are arranged in the same arrangement as the protrusions 81 on the thermal plate 61 (FIGS. 7A and 7B) of the substrate processing apparatuses 3, 4. Namely, when the warped wafer W is placed on the stage 92 (pins 93) of the warpage measurement unit 72, the wafer W is warped as if the wafer W were placed on the thermal plate 91.

In other words, the wafer W placed on the stage 92 (pins 93) shows the same warpage direction and the same degree of warpage as the same wafer W placed on the thermal stage 91 (protrusions 81).

Figure 11B:
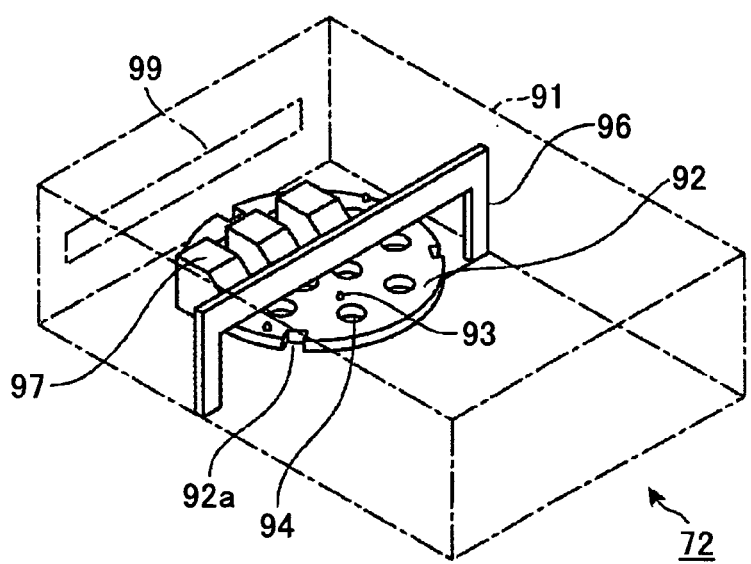
FIG. 11B is a perspective view of the warpage measurement unit shown in FIG. 11A.

As shown in FIGS. 11A and 11B, the stage 92 has plural through holes 94 through which the air between the stage 92 and the wafer W flows downward when the wafer W is placed on the stage 92.

As shown in FIG. 11A, the stage 92 is rotatably supported by a spindle 92b to which a driving mechanism 95 is coupled. The driving mechanism 95 can rotate and vertically move the spindle 92b and thus the stage 92. In the circumferential edge of the stage 92, there are provided cutouts 92a at positions corresponding to inward projections formed in a wafer fork (not shown) of the main transfer portion 25A (25A). Namely, the cutouts 92a allow the wafer fork of the main transfer portion 25A (25B) to vertically pass through the stage 92 when the wafer W is transferred between the stage 92 and the main transfer portion 25A. On the chassis 91, there is a transfer opening 99 through which the wafer W is transferred into and out from the chassis 91.

Referring to FIGS. 11A and 11B, plural (for example, three) laser displacement gauges 97 are supported above the stage 92 at the same intervals from the center to the circumferential edge of the stage 92 by a supporting member 96.

The laser displacement gauges 97 can emit laser beams to corresponding positions of the wafer W, namely, the center, the middle, and the circumferential portions of the wafer W, and detect reflection light reflected from the corresponding positions. Each of the laser displacement gauges 97 obtains data (a signal) indicating a period of time from the emission of the laser beam to the detection of the reflected light. Specifically, the laser displacement gauges 97 emit the laser beam and detect the reflected light while the wafer W is placed on the stage 92 and rotated by the driving mechanism 95. The periods of time are measured several times during one revolution of the wafer W.

Referring to FIG. 12, the warpage measurement unit 72 is added to the substrate processing apparatus 3 according to the second embodiment of the present invention and connected to the controlling portion 10a of the substrate processing apparatus 3. Through this connection, the data attained by the laser displacement gauges 97 are transmitted to the controlling portion 10a, and the warpage directions and the degree of warpage are determined by the controlling portion 10a in accordance with the data. Then, based on the warpage directions and the degree of warpage, the temperatures at and suction amounts from the gap regions 80a, 80b, 80c are adjusted in the following manner.

Specifically, the controlling portion 10a includes a table 18 to be used to determine the warpage directions and the degree of warpage in accordance with the data from the laser displacement gauges 97, as shown in FIG. 12. According to the table 18, the degree of warpage (information $A_1, A_2, \ldots$) can be determined by referring to a set of data (($Q_{11}, Q_{12}, Q_{13}$), ($Q_{21}, Q_{22}, Q_{23}$), . . . ), each element of which corresponds to the position (the center, the middle, the circumferential portions). In addition, the temperatures to be set at the gap regions 80a, 80b, 80c and thus the set temperatures of the heaters 64a, 64b, 64c are determined in association with the information $A_1, A_2, \ldots$, in advance in the table 18, though not shown. In such a manner, the temperatures of the heaters 64a, 64b, 64c are adjusted in accordance with the warpage directions and the degree of warpage measured by the warpage measurement unit 72.

When the warpage measurement unit 72 is used along with the substrate processing apparatus 3 (4), the warpage direction and the degree of warpage of the wafer W are measured before the wafer W is transferred to the substrate processing apparatus 3 (4). Therefore, the temperatures at the gap regions 80a, 80b, 80c can be adjusted in accordance with the warpage direction and the degree of warpage, thereby thermally processing the wafer W with higher temperature uniformity.

In addition, the controlling portion 10b may adjust the amounts of the air suctioned from the gap regions 80a, 80b, 80c in accordance with the information on the warpage directions and the degree of warpage of the wafer W. In this case, the wafer W is rapidly attracted onto the thermal plate 61 by suction, which contributes to improved temperature uniformity over the wafer W.

Moreover, both the temperatures at and the suction amounts from the gap regions 80a, 80b, 80c may be concurrently adjusted.

By the way, although the warpage measurement unit 72 is adapted to measure both the warpage direction and the degree of warpage, the warpage measurement unit 72 may measure only the warpage direction. Namely, the warpage measurement unit 72 may only determine whether the wafer W is warped concavely (into a bowl shape) or convexly (into a dome shape). In this case, the temperatures at and the suction amounts from the gap regions 80a, 80b, 80c are set to be predetermined values in a one-on-one basis in accordance with the warpage directions measured by the warpage measurement unit 72. In addition, although the stage 92 can be rotated by the driving mechanism 86 in the warpage measurement unit 72, the supporting member 96 may be rotated instead. Moreover, some elements of the warpage measurement unit 72 may be integrated into the substrate processing apparatus 3 (4). Namely, when the supporting member 96, the laser displacement gauges 97, and a rotation mechanism for rotating the thermal stage 61 or the laser displacement gauges 97 are integrated into the substrate processing apparatus 3 (4) so as to be operable in the aforementioned manner, the warpage directions and the degree of warpage can be measured in the substrate processing apparatus 3 (4).

Figure 13A:
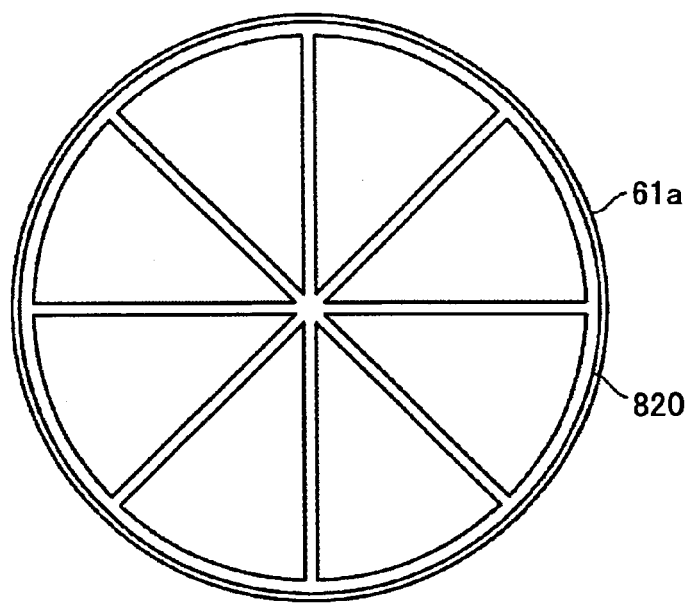
FIGS. 13A through 13C are plan views of other examples of the thermal plate provided in the substrate processing apparatuses according to the embodiments of the present invention.

In the second and the third embodiments of the present invention, while the thermal plate 61 contains the heaters 64a, 64b, 64c located concentrically inside, the thermal plate 61 may contain two separate heaters, or three or more (for example, four, five, . . . ) separate heaters. In addition, the plural heaters may be arranged in the circumferential direction rather than the radial direction. With such a change in the arrangement of the heaters, the gap 80 may be also divided into different gap regions, as shown in FIG. 13A. Referring to FIG. 13A, a hub-shaped partition 820 is attached on a thermal plate 61a. The partition 820 has eight spokes at equal angular intervals (45 degrees). Due to the partition 820, there are eight sector-shaped gap regions on the thermal plate 61. Such a configuration can readily keep the wafer W on the thermal plate 61a (or the protrusions (not shown) located on the thermal plate 61a) with a smaller suction amount of the air, especially when the wafer W is complexly warped, for example, corrugated along the circumferential direction, or twisted. It should be noted that the number of the sector gap regions in this type of gap arrangement is not limited to eight but may be four, sixteen or the like.

Figure 13B:
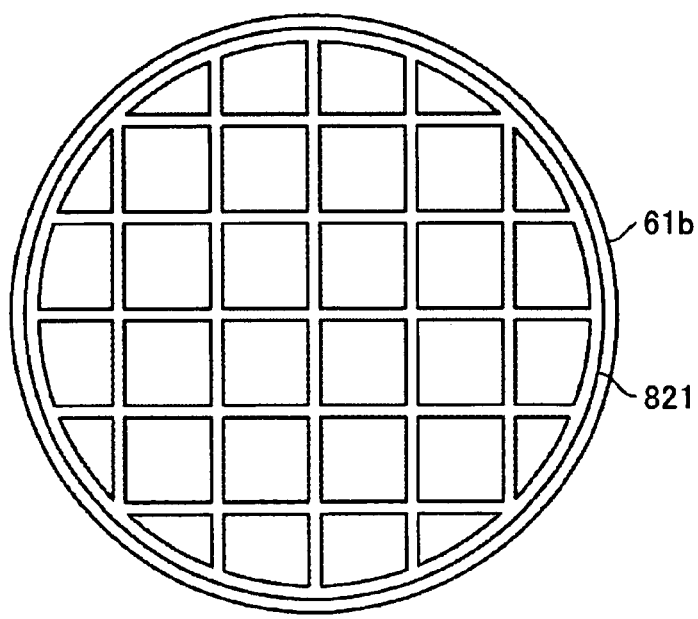

Moreover, a plan view shape of the gap regions is not limited to be a circle, a ring (FIG. 7B), or a sector (FIG. 13A) but may be a square as shown in FIG. 13B. Referring to FIG. 13B, a grid-shaped partition 821 is attached on a thermal plate 61b. The partition 821 can divide the gap into sixteen square gap regions and another sixteen gap regions. Such a gap arrangement can readily keep the wafer W on the thermal plate 61a (or the protrusions (not shown) located on the thermal plate 61a) with a smaller suction amount of the air, even when the wafer W is warped into any shape. Even in this arrangement, the number of gap regions is not limited but may be three, six, ten or the like. In addition, the number of gaps along the vertical direction in the drawing may be different from the number of gaps along the lateral direction.

Figure 13C:
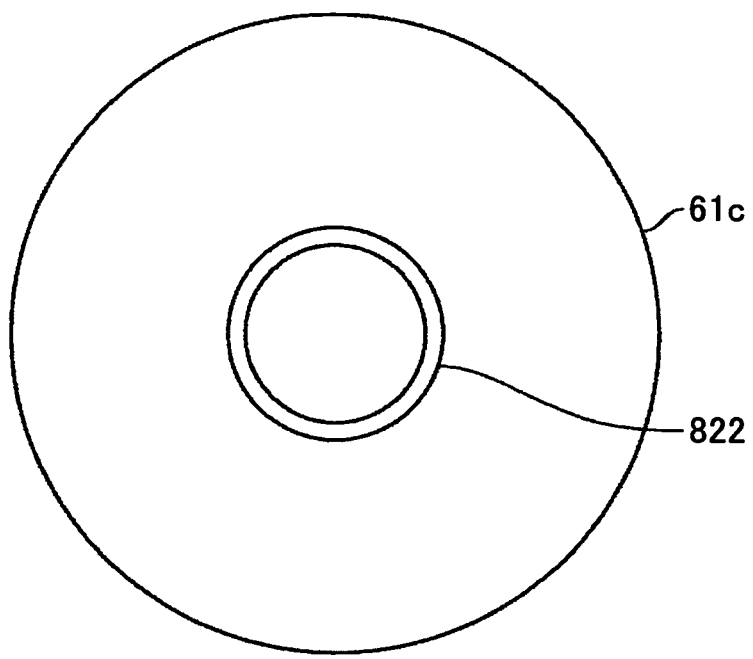

The partitions 82, 820, 821 have substantially the same (or slightly smaller) diameter as the thermal plates 61, 61a, 61b so as to allow the gap to cover substantially the entire area of the thermal plates 61, 61a, 61b, respectively. However, the partition may have a diameter smaller than the thermal plate as long as the gap can be two dimensionally closed. Such an example is illustrated in FIG. 13C, in which a ring shaped partition 822 is attached on the top surface of a thermal plate 61c. As shown, the gap region enclosed by the partition 822 has a smaller diameter than the thermal plate 61c (or the wafer W). In addition, the partition 822 is not necessarily located concentric with the thermal plate 61c but may be non-concentrically located. Moreover, the shape of the partition 822 is not limited to a ring but may be a square.

By the way, in the thermal plates 61a, 61b, 61c, the temperatures at and the suction amount from the gap regions can be adjusted in the same manner as described above.

Furthermore, although the substrate processing apparatuses 2, 3, 4 according to the embodiments of the present invention are configured so as to have the thermal plate 61 containing the heaters 64a, 64b, 64c so as to heat the wafer W, the substrate processing apparatus may be configured to include a thermal plate containing a cooling element so as to cool the wafer W in other embodiments of the present invention. Or, the substrate processing apparatus may include a thermal plate having a heater and a cooling element in other embodiments. Additionally, the substrate processing apparatuses 2, 3, 4 are not necessarily implemented into the coater/developer 20 but may be used as a separate heat-exchange apparatus for wafers.

EXAMPLE

Next, experiments carried out to confirm the effects of the above embodiments of the present invention are described. In the experiments, the substrate processing apparatus 2 according to the first embodiment of the present invention was used. Specifically, the rings 82a, 82b, 82c (partition 82) were attached on the thermal plate 61 in the substrate processing apparatus 2. In addition, a substrate processing apparatus that is substantially the same as the substrate processing apparatus 2 but has no partitions on a thermal plate was prepared for comparison purpose. In the following, the thermal plate having no partitions is referred to as the thermal plate 90. The wafers W used in the experiments were intentionally warped. Moreover, a high speed camera was provided in the substrate processing apparatuses in order to observe warpage of the wafers W on the thermal plates 61, 90.

Figure 14:
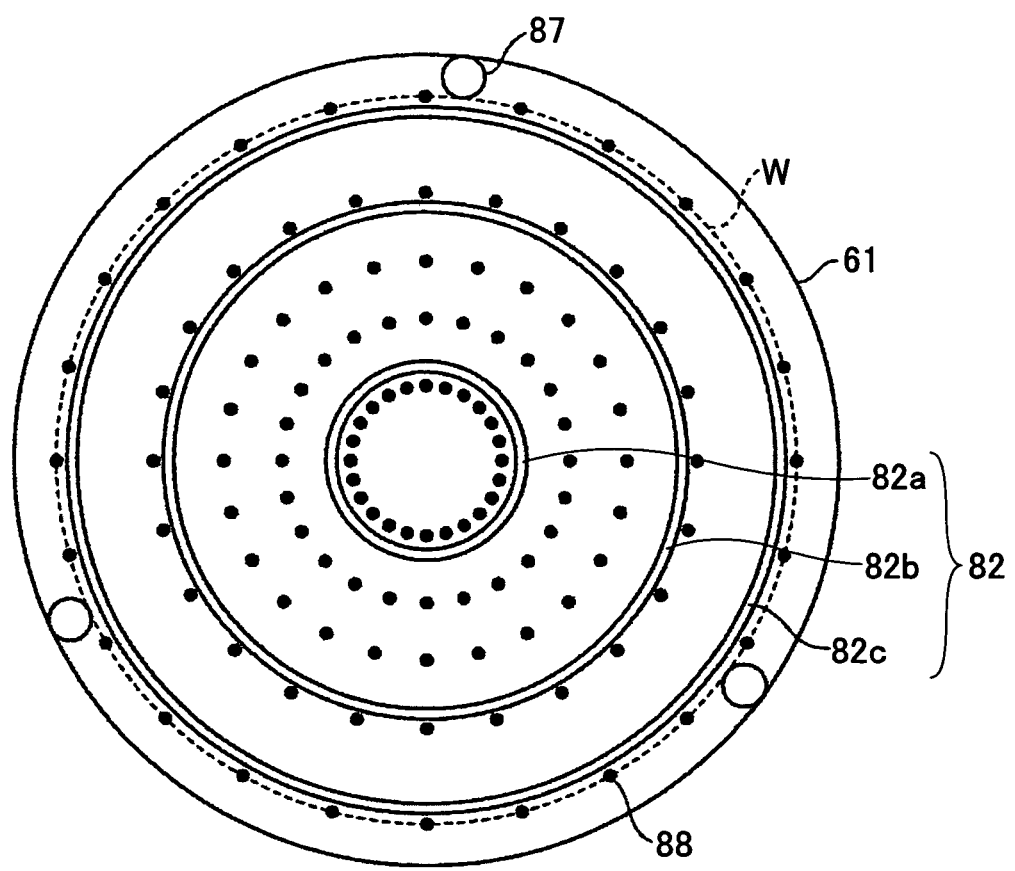
FIG. 14 is a plan view of the thermal plate used in experiments carried out to confirm effects demonstrated by the substrate processing apparatuses according to the embodiments of the present invention, illustrating arrangement of plural sensors used for the experiments.

Furthermore, plural pressure sensors 88 were provided on the thermal plates 61, 90 in order to measure pressure (suction amount) applied onto the wafer W kept on the thermal plates 61, 90 by suction, as shown in FIG. 14. Referring to FIG. 14, the pressure sensors 88 were arranged along five concentric circles in order to obtain pressure distribution along the radial and the circumferential directions. The number of pressure sensors along each concentric circle was twenty-four. In addition, the smallest one of the concentric circles was inside the ring 82a; two other of the concentric circles were between the rings 82a, 82b; the second largest one of the concentric circles was located near and surrounding the ring 82b; and the largest one of the concentric circle was located near and surrounding the ring 82c. By the way, although FIG. 14 shows just the sensor arrangement on the thermal plate 61, the sensors were arranged on the thermal plate 90 in the same arrangement. In addition, the protrusions 81 and the suction holes 83 (FIG. 7B) are omitted in FIG. 14 for simplicity of illustration.

Experiment 1

The warped wafer W prepared for the experiments was placed on the thermal plate 61 and the suction amount was gradually increased until the warped wafer W is kept flat with respect to the thermal plate 61. The suction amount when the wafer W becomes flat is assumed to be a value X.

Comparative Experiment 1

The warped wafer W for the experiments was placed on the thermal plate 90 and the suction amount was gradually increased until the warped wafer W is kept flat with respect to the thermal plate 90.

Comparative Experiment 2

The warped wafer W prepared for the experiments was placed on the thermal plate 90 and the suction amount was set to be the value X obtained in the Experiment 1.

Experiment Results

Figure 15A:
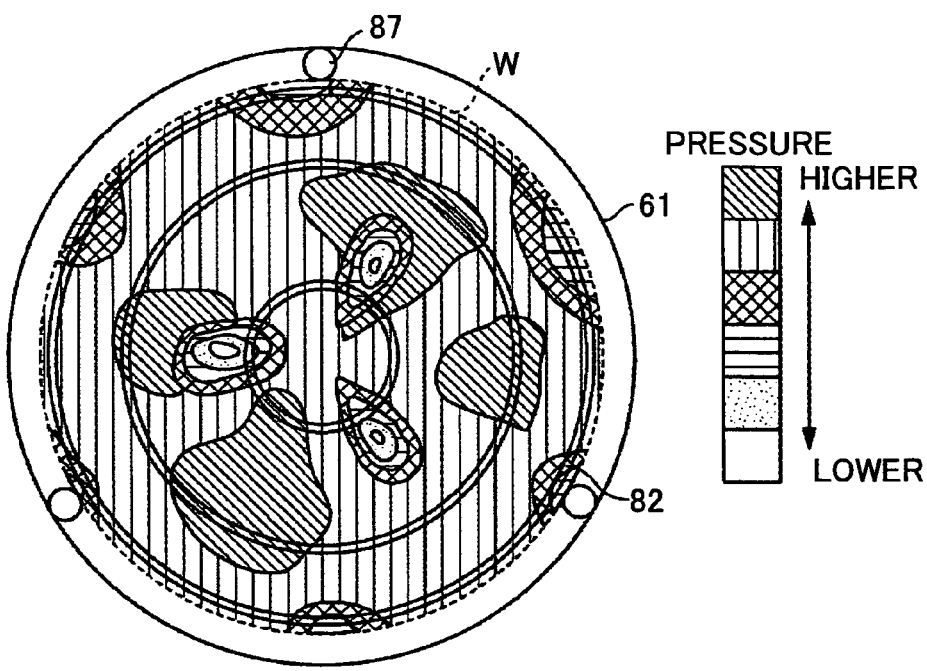
FIGS. 15A through 15C show experimental results, where distributions of pressure applied to the substrate placed on the thermal plate are illustrated.
Figure 15B:
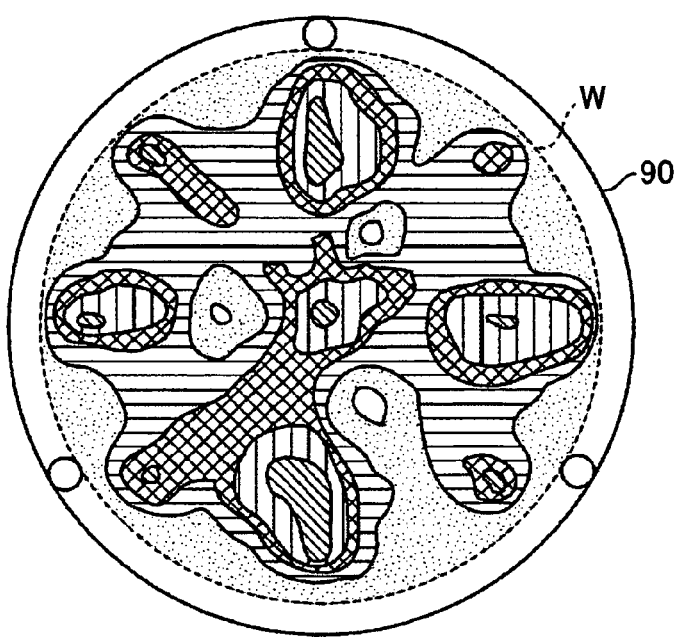
Figure 15C:
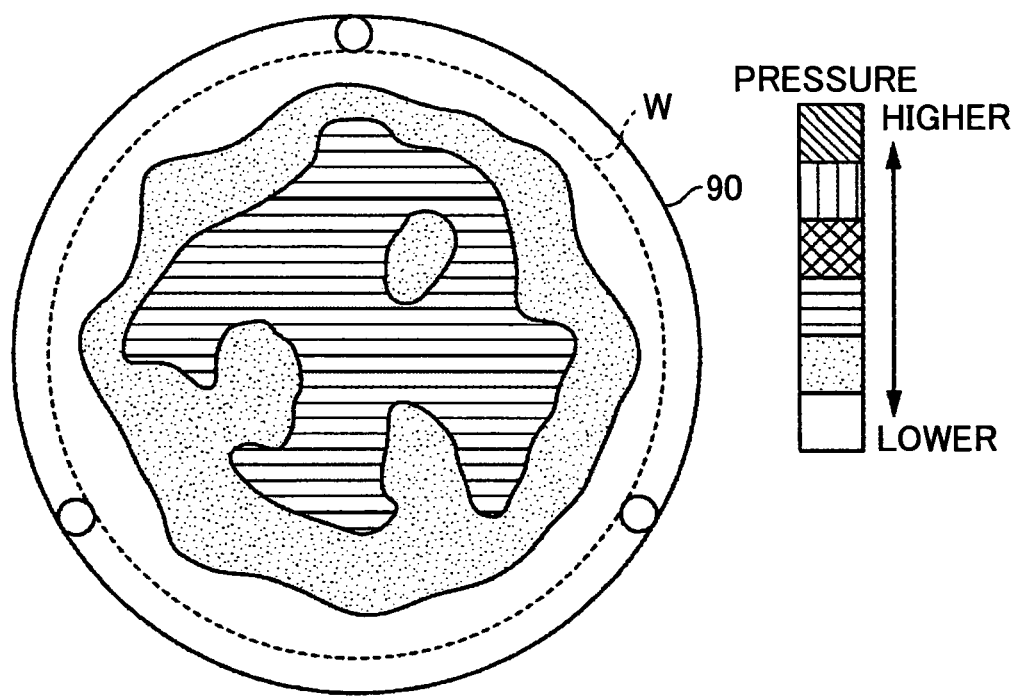

Pressure distributions obtained by the pressure sensors 88 in the Experiment 1 and the Comparative Experiments 1, 2 are illustrated in FIGS. 15A, 15B, and 15C, respectively. As shown in FIG. 15A, there is only a small difference between the highest pressure and the lowest pressure applied to the wafer W. This result indicates that the wafer W is evenly attracted onto the thermal plate 61 in the Experiment 1.

On the other hand, in the Comparative Experiment 1, pressure variations are rather large as shown in FIG. 15B. Specifically, the pressure on the wafer W is largest in portions corresponding to the suction holes 83 (FIG. 7B) and lowest in portions near the wafer edge, which may mean that a relatively large amount of the air is suctioned from the edge of the wafer W.

Moreover, the amount of air suctioned by the suction apparatus 86 is about four times larger than the amount of air in the Experiment 1. This indicates that only one-fourth of the air needs to be suctioned in the Experiment 1 and such superior effect is brought about by the partition 82 (the rings 82a, 82b, 82c). In contrast, a larger amount of the air needs to be suctioned in the Comparative Experiment 1 because no partitions are provided on the thermal plate 90.

From the experiment results shown above, it is considered that the wafer W is more flat on the thermal plate 61 having the partition 82 than on the thermal plate 90 having no partitions, and the temperature uniformity over the wafer W can be more improved in the thermal plate 61 than in the thermal plate 90. Moreover, when the thermal plate 61 is used, since the range of the pressure applied to the wafer W is small, it is considered that excessive pressure is not locally applied to the wafer W and thus the wafer W may be protected from damage or breakage.

In addition, when the same suction amount in the Experiment 1 is used in the thermal plate 90 in the Comparative Experiment 2, although the pressure difference is comparative to the experimental result in the Experiment 1, as shown in FIG. 15C, the pressure is generally lower compared to the result shown in FIG. 15A. It is found that the shape of the warped wafer W cannot be sufficiently made flat with respect to the thermal plate 90 in the Comparative Experiment 2. This is another indication of the effect demonstrated by the embodiment of the present invention.

By the way, it is found in FIGS. 15A through 15C that there are three portions indicating a lower pressure near the center of the thermal plates 61, 90. These portions correspond to where the through holes 48 for the supporting pins 47*b* are formed. Even if there are such portions, the above experiment results hold true.

Although the present invention has been described in conjunction with the foregoing specific embodiments, the present invention is not limited to the embodiments specifically disclosed herein, but various alterations and modifications may be applied without departing from the scope of the invention set forth in accompanying claims.

The present application is based on Japanese Patent Application No. 2007-008431 filed with the Japanese Patent Office on Jan. 17, 2007, the entire contents of which are incorporated herein by reference.

What is claimed is:

1. A substrate processing apparatus adapted to heat and/or cool a substrate, the apparatus comprising:
   a heat exchange plate configured to heat and/or cool the substrate;
   plural protrusions provided on the heat exchange plate so as to allow the substrate to be placed on the plural protrusions, leaving a gap between the substrate and the heat exchange plate;
   a suction portion configured to attract the substrate onto the plural protrusions by suction through plural holes formed in the heat exchange plate; and
   a partition member that is provided on the heat exchange plate and lower than the plural protrusions, wherein the partition member is configured to divide the gap into two or more regions each including at least one of the plural holes so that at least one of the two or more regions is two-dimensionally closed by the partition member, wherein
   the partition member comprises:
      a first ring-like partition member arranged on the heat exchange plate concentrically at a first diameter from a center of the substrate placed on the plural protrusions; and
      a second ring-like partition member arranged on the heat exchange plate concentrically at a second diameter, larger than the first diameter, from the center of the substrate placed on the plural protrusions,
   one or more of the plural protrusions are provided both inside the first ring-like partition member and outside the first ring-like partition member on the heat exchange plate, and
   the plural protrusions are formed into pins.

2. The substrate processing apparatus of claim 1, wherein the partition member divides the gap into the two or more regions so that the two or more regions are arranged in a radial direction.

3. The substrate processing apparatus of claim 2, wherein a part of the partition member is located along and substantially beneath a circumferential portion of the substrate to be placed on the plural protrusions.

4. The substrate processing apparatus of claim 1, wherein the heat exchange plate is configured to contain heat exchange elements corresponding to the two or more regions so as to independently control temperatures of the two or more regions.

5. The substrate processing apparatus of claim 1, further comprising a substrate warpage measurement unit that measures warpage of the substrate so as to generate information indicating at least warpage direction of the substrate,
   wherein the heat exchange plate is configured to contain heat exchange elements corresponding to the two or more regions so as to independently control temperatures of the two or more regions in accordance with the information.

6. The substrate processing apparatus of claim 1, further comprising a substrate warpage measurement unit that measures warpage of the substrate so as to generate information indicating at least warpage direction of the substrate,
   wherein the heat exchange plate is configured to contain heat exchange elements corresponding to the two or more regions so as to independently control temperatures of the two or more regions in accordance with the information, and
   wherein the suction portion is configured to include suction amount adjustment portions corresponding to the two or more regions so as to independently control suction amounts from the two or more regions in accordance with the information.

7. The substrate processing apparatus of claim 1, wherein the suction portion is configured to include suction amount adjustment portions corresponding to the two or more regions so as to independently control suction amounts from the two or more regions.

8. The substrate processing apparatus of claim 1, further comprising a substrate warpage measurement unit that measures warpage of the substrate so as to generate information indicating at least warpage direction of the substrate,
   wherein the suction portion is configured to include suction amount adjustment portions corresponding to the two or more regions so as to independently control suction amounts from the two or more regions in accordance with the information.

9. The substrate processing apparatus of claim 5, wherein the information further includes a degree of warpage of the substrate.

10. The substrate processing apparatus of claim 8, wherein the information further includes a degree of warpage of the substrate.

11. A substrate processing method for heating and/or cooling a substrate, comprising steps of:
   placing the substrate on plural protrusions that are provided on a heat exchange plate so as to create a gap between the substrate and the heat exchange plate;
   attracting the substrate onto the plural protrusions by suction through two or more gap regions defined by dividing the gap using a partition member that is provided on the heat exchange plate and lower than the plural protrusions, at least one of the gap regions being two-dimensionally closed by the partition member, and
   heating and/or cooling the substrate attracted onto the plural protrusions through the two or more gap regions, wherein
   the partition member comprises:
      a first ring-like partition member arranged on the heat exchange plate concentrically at a first diameter from a center of the substrate placed on the plural protrusions; and
      a second ring-like partition member arranged on the heat exchange plate concentrically at a second diameter, larger than the first diameter, from the center of the substrate placed on the plural protrusions, one or more of the plural protrusions are provided both inside the first ring-like partition member and outside the first ring-like partition member on the heat exchange plate, and the plural protrusions are formed into pins.

12. The substrate processing method of claim 11, wherein the partition member divides the gap into the two or more regions so that the two or more regions are arranged in a radial direction.

13. The substrate processing method of claim 12, wherein a part of the partition member is located substantially below and along a circumferential portion of the substrate to be placed on the plural protrusions.

14. The substrate processing method of claim 11, wherein the step of heating and/or cooling independently heats and/or cools the two or more gap regions.

15. The substrate processing method of claim 11, further comprising a step of measuring warpage of the substrate so as to generate information indicating at least warpage direction of the substrate,
wherein the step of heating and/or cooling independently controls temperatures of the two or more gap regions in accordance with the information.

16. The substrate processing method of claim 11, wherein the step of attracting attracts the substrate onto the plural protrusions with suction amounts corresponding to the two or more gap regions.

17. The substrate processing method of claim 11, further comprising a step of measuring warpage of the substrate so as to generate information indicating at least warpage direction of the substrate,
wherein the step of attracting attracts the substrate onto the plural protrusions with suction amounts corresponding to the two or more gap regions in accordance with the information.

18. The substrate processing method of claim 15, wherein the information further includes a degree of warpage of the substrate.

19. The substrate processing method of claim 17, wherein the information further includes a degree of warpage of the substrate.

20. The substrate processing apparatus of claim 1, wherein the partition member defines a two-dimensionally closed periphery for at least one of the two or more regions in a first horizontal plane, while continuing to permit an air-flow communication between at least two of the two or more regions in a second horizontal plane.

21. The substrate processing method of claim 11, wherein the partition member defines a two-dimensionally closed periphery for at least one of the two or more regions in a first horizontal plane, while continuing to permit an air-flow communication between at least two of the two or more regions in a second horizontal plane.

\* \* \* \* \*